(12) United States Patent
Luo et al.

(10) Patent No.: US 11,605,642 B2
(45) Date of Patent: Mar. 14, 2023

(54) MICROELECTRONIC DEVICES INCLUDING STAIR STEP STRUCTURES, AND RELATED MEMORY DEVICES, ELECTRONIC SYSTEMS, AND METHODS

(71) Applicant: Micron Technology, Inc., Boise, ID (US)

(72) Inventors: Shuangqiang Luo, Boise, ID (US); Brett D. Lowe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 27 days.

(21) Appl. No.: 17/124,313

(22) Filed: Dec. 16, 2020

(65) Prior Publication Data
US 2022/0189982 A1 Jun. 16, 2022

(51) Int. Cl.
*H01L 27/11556* (2017.01)
*H01L 23/528* (2006.01)
(Continued)

(52) U.S. Cl.
CPC ........ *H01L 27/11556* (2013.01); *G11C 5/025* (2013.01); *G11C 5/06* (2013.01); *H01L 23/528* (2013.01); *H01L 27/11582* (2013.01)

(58) Field of Classification Search
CPC ......... H01L 27/11556; H01L 27/11582; H01L 27/11519; H01L 27/0207; H01L 27/11548;
(Continued)

(56) References Cited

U.S. PATENT DOCUMENTS

| | | | |
|---|---|---|---|
| 10,580,795 B1 * | 3/2020 | Luo | H01L 27/11556 |
| 2015/0372101 A1 * | 12/2015 | Lee | H01L 27/11575 |
| | | | 257/314 |

(Continued)

FOREIGN PATENT DOCUMENTS

WO 2020/005335 A1 1/2020

OTHER PUBLICATIONS

International Search Report for Application No. PCT/US2021/059962, dated Mar. 14, 2022, 3 pages.
(Continued)

*Primary Examiner* — Galina G Yushina
(74) *Attorney, Agent, or Firm* — TraskBritt

(57) ABSTRACT

A microelectronic device comprises a stack structure comprising a vertically alternating sequence of conductive structures and insulative structures arranged in tiers, the stack structure divided into block structures separated from one another by slot structures, a staircase structure within the stack structure having steps comprising horizontal edges of the tiers, conductive contact structures in contact with the steps of the staircase structure, support pillar structures extending through the stack structure, and additional slot structures extending partially through the stack structure within one of the block structures, one of the additional slot structures extending between horizontally neighboring support pillar structures and closer to one of the horizontally neighboring support pillar structures than to an additional one of the horizontally neighboring support pillar structures. Related microelectronic devices, memory devices, and electronic systems are also described.

22 Claims, 15 Drawing Sheets

(51) Int. Cl.
  *H01L 27/11582* (2017.01)
  *G11C 5/02* (2006.01)
  *G11C 5/06* (2006.01)

(58) Field of Classification Search
  CPC ......... H01L 27/11565; H01L 27/11575; H01L 23/528; G11C 5/025; G11C 5/06; G06F 30/00
  See application file for complete search history.

(56) References Cited

U.S. PATENT DOCUMENTS

| | | | |
|---|---|---|---|
| 2017/0125522 A1 | 5/2017 | Sim et al. | |
| 2018/0261529 A1 | 9/2018 | Yoshimizu et al. | |
| 2018/0261608 A1* | 9/2018 | Matsuura | H01L 27/11565 |
| 2019/0341396 A1* | 11/2019 | You | H01L 29/788 |
| 2020/0119040 A1 | 4/2020 | King et al. | |
| 2020/0303300 A1* | 9/2020 | Kato | H01L 27/1157 |
| 2021/0193574 A1* | 6/2021 | Sun | H01L 27/11565 |
| 2021/0265268 A1* | 8/2021 | Su | H01L 23/5226 |
| 2022/0181347 A1* | 6/2022 | Hu | H01L 21/76885 |

OTHER PUBLICATIONS

Written Opinion of the International Searching Authority for Application No. PCT/US2021/059962, dated Mar. 14, 2022, 4 pages.

* cited by examiner

MICROELECTRONIC DEVICES INCLUDING STAIR STEP STRUCTURES, AND RELATED MEMORY DEVICES, ELECTRONIC SYSTEMS, AND METHODS

TECHNICAL FIELD

The disclosure, in various embodiments, relates generally to the field of microelectronic device design and fabrication. More specifically, the disclosure relates to microelectronic devices, and related electronic systems and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include additional tiers of conductive structures and, hence, additional staircase structures and/or additional steps in individual staircase structures associated therewith. However, increasing the quantity of tiers of conductive structures (and hence, the quantity of staircase structures and/or the quantity of steps in individual staircase structures) of a stack structure without undesirably increasing the overall width (e.g., lateral footprint) of the stack structure can result in undesirably complex and congested routing paths to electrically connect the conductive structures to additional components (e.g., string drivers) of the memory device. Other methods of increasing the memory density may include reducing the lateral footprint (real estate) of the vertical memory arrays. However, reducing the lateral footprint of the vertical memory array is hindered by the complex and congested routing paths to electrically connect the conductive structures to additional components (e.g., string drivers) of the memory device.

DETAILED DESCRIPTION

Figure 1A:
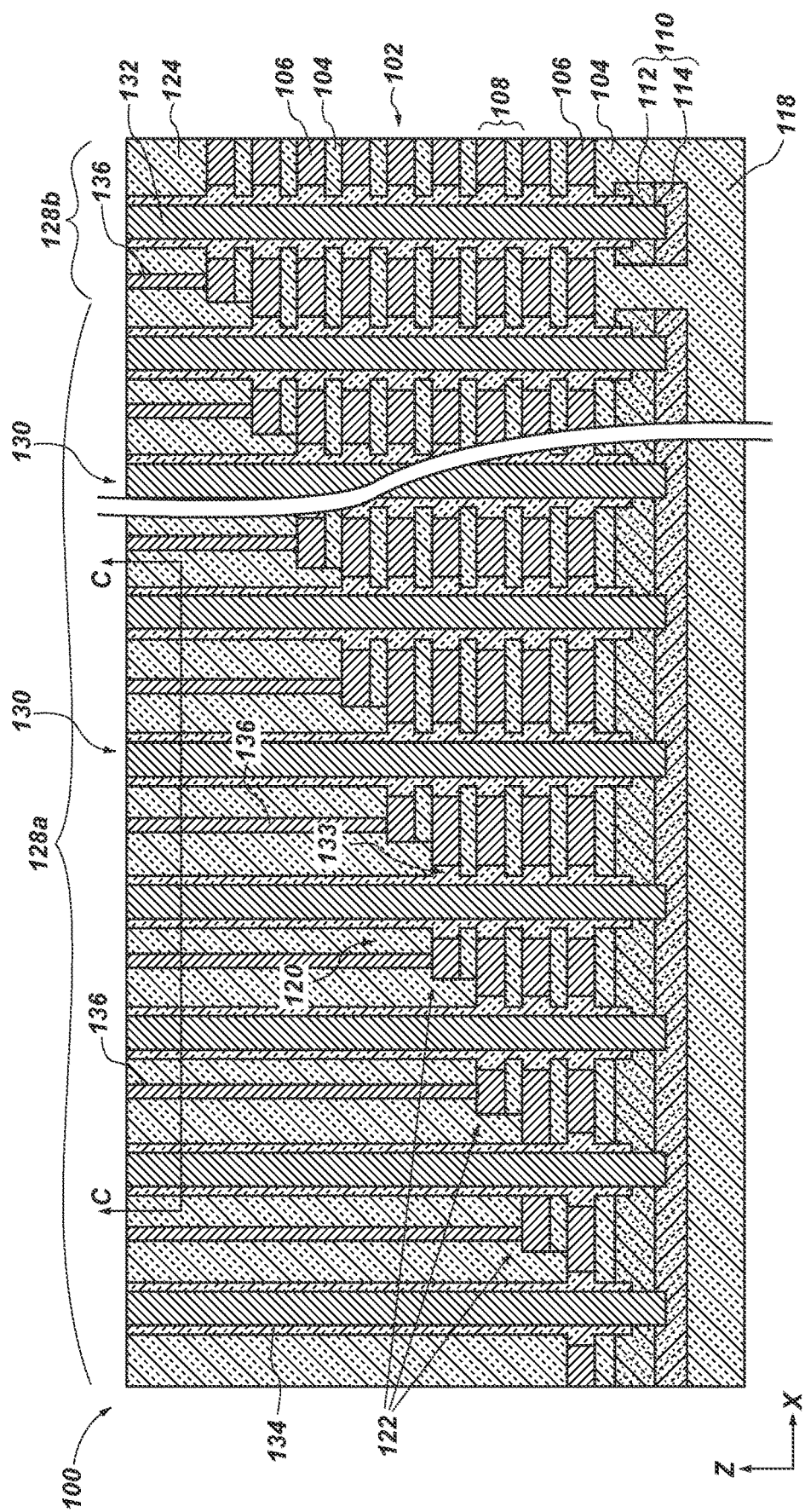
FIG. 1A through FIG. 1G are simplified cross-sectional views (FIG. 1A, FIG. 1B, FIG. 1D, and FIG. 1F) and top-down views (FIG. 1C, FIG. 1E, and FIG. 1G) illustrating a method of forming a microelectronic device, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device structure or microelectronic device (e.g., a memory device, such as a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessary limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device structure includes a stack structure comprising a vertically alternating sequence of conductive structures and insulative structures arranged in tiers. The microelectronic device structure may be divided into block structures defined within horizontal boundaries between horizontally neighboring slot structures extending vertically through the stack structure. Each block structure may include one or more staircase structures, the staircase structures including steps comprising edges of at least some of the tiers of the stack structure. Each block structure may be divided into sub-block structures by additional slot structures extending partially vertically through the stack structure in at least one of the staircase structures and a crest region between horizontally neighboring staircase structures. The sub-block structures may exhibit different horizontal dimensions (e.g., widths) based on the location of the additional slot structures within the block structure. In some embodiments, the sub-block structures horizontally neighboring the slot structures exhibit a greater horizontal dimension than the sub-block structures spaced from the slot structures by an additional sub-block structure.

Conductive contact structures may be electrically connected to the steps of the staircase structure. In some embodiments, each step within a sub-block structure may be contacted by a conductive contact structure. Support pillar structures may extend through the staircase structure and may be horizontally offset from the conductive contact structures. The additional slot structures may horizontally intervene between horizontally neighboring rows of the support pillar structures. In some embodiments, the additional slot structures horizontally intervening between the rows of the support pillar structures may be located closer to one of the rows of support pillar structures than to the other row of the support pillar structures. The increased distance between the other row of the support pillar structures and the additional slot structures may facilitate an increased area (e.g., margin) for the support pillar structures and the additional slot structures without interrupting the routing of conductive routing structures within the sub-block structures. In some embodiments, the placement of the additional slot structures facilitates a reduction in an area (e.g., by decreasing one or both of a width and a length) of the block structures while providing sufficient area for conductive routing structures, the support pillar structures, and the conductive contact structures.

FIG. 1A through FIG. 1G illustrate a method of forming a microelectronic device structure 100 for a microelectronic device (e.g., a memory device, such as a 3D NAND Flash memory device), in accordance with embodiments of the disclosure. With the description provided below, it will be readily apparent to one of ordinary skill in the art that the methods and structures described herein with reference to FIG. 1A through FIG. 1G may be used in the formation and configuration of various devices and electronic systems.

Figure 1B:
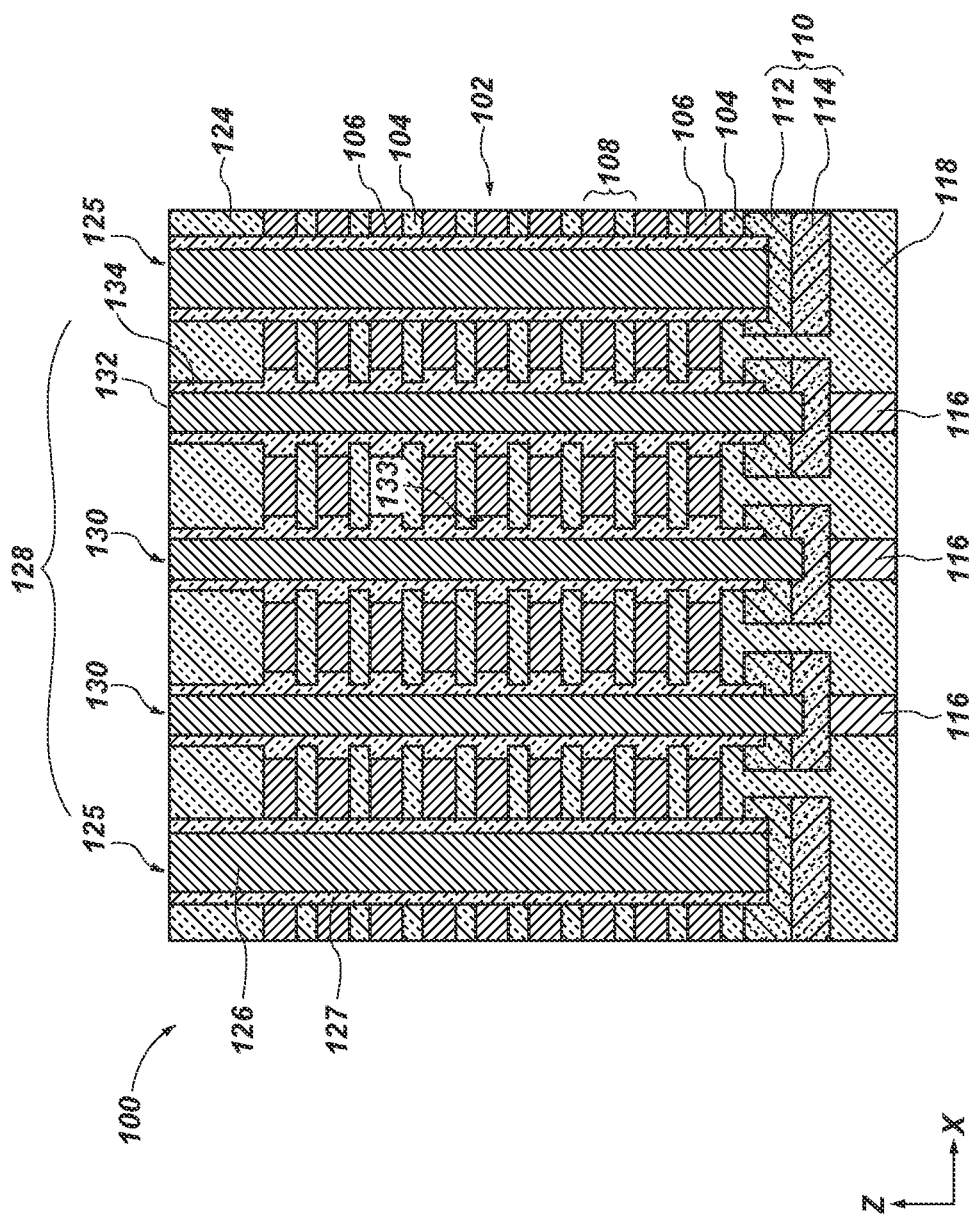
Figure 1C:
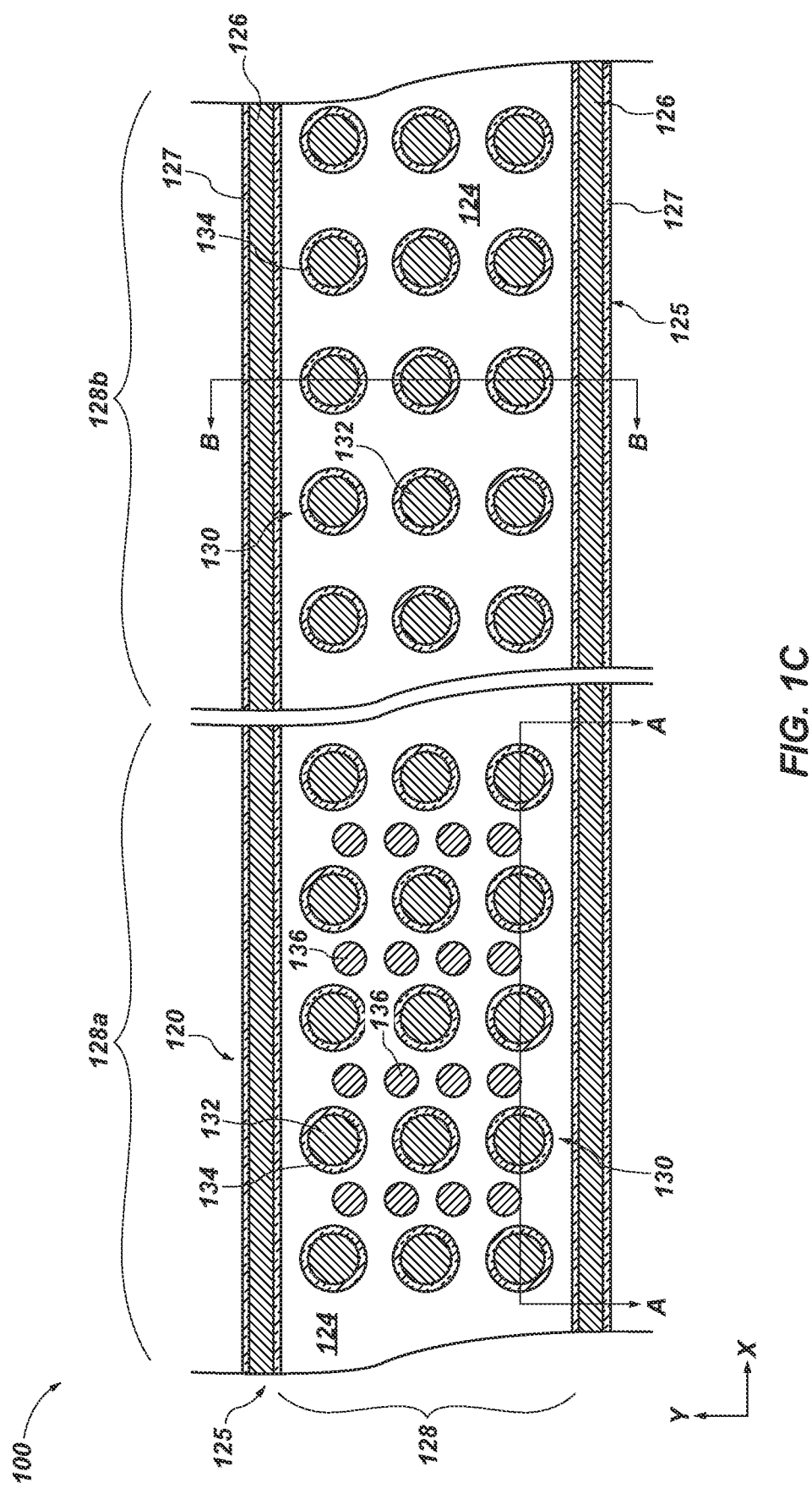

FIG. 1A and FIG. 1B are simplified partial cross-sectional views of a microelectronic device structure 100 and FIG. 1C is a simplified top-down view of the microelectronic device structure 100, in accordance with embodiments of the disclosure. FIG. 1A is a cross-section of the microelectronic device structure 100 taken through section line A-A of FIG. 1C and FIG. 1B is a cross-section of the microelectronic device structure 100 taken through section line B-B of FIG. 1C. The microelectronic device structure 100 may, for example, comprise a portion of a memory device (e.g., a multi-deck 3D NAND Flash memory device, such as a dual deck 3D NAND Flash memory device).

With reference to FIG. 1A and FIG. 1B, the microelectronic device structure 100 includes a stack structure 102 including a vertically alternating (e.g., in the Z-direction) sequence of insulative structures 104 and conductive structures 106 (e.g., access line plates, word line plates) arranged in tiers 108. Each of the tiers 108 of the stack structure 102 may include at least one (1) of the insulative structures 104 vertically-neighboring at least one of the conductive structures 106.

The insulative structures 104 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 104 comprise silicon dioxide. Each of the insulative structures 104 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 104 of each of the tiers 108 of the stack structure 102 exhibits a substantially homogeneous distribution of insulative material. In additional embodiments, at least one of the insulative structures 104 of at least one of the tiers 108 of the stack structure 102 exhibits a substantially heterogeneous distribution of at least one insulative material. The insulative structures 104 may, for example, be formed of and include a stack (e.g., laminate) of at least two different insulative materials. The insulative structures 104 of each of the tiers 108 of the stack structure 102 may each be substantially planar, and may each individually exhibit a desired thickness.

The conductive structures 106 of the tiers 108 of the stack structure 102 may be formed of and include at least one conductive material, such as a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), a conductive metal-containing material (e.g., a conductive metal nitride, a conductive metal silicide, a conductive metal carbide, a conductive metal oxide), or combinations thereof. In some embodiments, the conductive structures 106 are formed of and include tungsten.

Each of the conductive structures 106 may individually include a substantially homogeneous distribution of the at least one conductive material, or a substantially heterogeneous distribution of the at least one conductive material. In some embodiments, each of the conductive structures 106 of each of the tiers 108 of the stack structure 102 exhibits a substantially homogeneous distribution of conductive material. In additional embodiments, at least one of the conductive structures 106 of at least one of the tiers 108 of the stack structure 102 exhibits a substantially heterogeneous distribution of at least one conductive material. The conductive structure 106 may, for example, be formed of and include a stack of at least two different conductive materials. The conductive structures 106 of each of the tiers 108 of the stack structure 102 may each be substantially planar, and may each exhibit a desired thickness.

In some embodiments, the conductive structures 106 may include a conductive liner material around the conductive structures 106, such as between the conductive structures 106 and the insulative structures 104. The conductive liner material may comprise, for example, a seed material from which the conductive structures 106 may be formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride.

At least one lower conductive structure 106 of the stack structure 102 may be employed as at least one lower select gate (e.g., at least one source side select gate (SGS)) of the microelectronic device structure 100. In some embodiments, a single (e.g., only one) conductive structure 106 of a vertically lowermost tier 108 of the stack structure 102 is employed as a lower select gate (e.g., a SGS) of the microelectronic device structure 100. In addition, upper conductive structure(s) 106 of the stack structure 102 may be employed as upper select gate(s) (e.g., drain side select gate(s) (SGDs)) of the microelectronic device structure 100. In some embodiments, horizontally-neighboring conductive structures 106 of a vertically uppermost tier 108 of the stack structure 102 are employed as upper select gates (e.g., SGDs) of the microelectronic device structure 100.

Although FIG. 1A and FIG. 1B illustrate a particular number of tiers 108 of the insulative structures 104 and the conductive structures 106, the disclosure is not so limited. In some embodiments, the stack structure 102 includes a desired quantity of the tiers 108, such as sixty-four (64) of the tiers 108. In other embodiments, the stack structure 102 includes a different number of the tiers 108, such as less than sixty-four (64) of the tiers 108 (e.g., less than or equal to sixty (60) of the tiers 108, less than or equal to fifty (50) of the tiers 108, less than about forty (40) of the tiers 108, less than or equal to thirty (30) of the tiers 108, less than or equal to twenty (20) of the tiers 108, less than or equal to ten (10) of the tiers 108); or greater than sixty-four (64) of the tiers 108 (e.g., greater than or equal to seventy (70) of the tiers 108, greater than or equal to one hundred (100) of the tiers 108, greater than or equal to about one hundred twenty-eight (128) of the tiers 108) of the insulative structures 104 and the conductive structures 106. In addition, in some embodiments, the stack structure 102 overlies a deck structure comprising additional tiers 108 of insulative structures 104 and conductive structures 106, separated from the stack structure 102 by at least one dielectric material, such as an interdeck insulative material.

With continued reference to FIG. 1A and FIG. 1B, the microelectronic device structure 100 further includes a source tier 110 vertically underlying (e.g., in the Z-direction) the stack structure 102. The source tier 110 may comprise, for example, a first source material 112 and a second source material 114. The first source material 112 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy), a conductive metal-containing material (e.g., a conductive metal nitride, a conductive metal silicide, a conductive metal carbide, a conductive metal oxide), or a doped semiconductor material (e.g., a semiconductor material doped with one or more P-type dopants (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorous, antimony, and bismuth)). In some embodiments, the first source material 112 comprises conductively-doped silicon.

The second source material 114 may be formed of and include tungsten silicide ($WSi_x$), tungsten nitride, and tungsten silicon nitride ($WSi_xN_y$). In some embodiments, the second source material 114 comprises tungsten silicide.

The microelectronic device structure 100 may further include at least one staircase structure 120 (FIG. 1A, FIG. 1C) including steps 122 (e.g., contact regions) (FIG. 1A) defined by horizontal edges of the tiers 108. The quantity of steps 122 included in the staircase structure 120 may be substantially the same as (e.g., equal to) or may be different than (e.g., less than, greater than) the quantity of tiers 108 in each the stack structure 102. As shown in FIG. 1A, in some embodiments, the steps 122 of the staircase structure 120 are arranged in order, such that steps 122 directly horizontally neighboring one another in the X-direction correspond to tiers 108 of the stack structure 102 directly vertically adjacent (e.g., in the Z-direction) one another. In additional embodiments, the steps 122 of the staircase structure 120 are arranged out of order, such that at least some steps 122 of the staircase structure 120 directly horizontally neighboring one another in the X-direction correspond to tiers 108 of stack structure 102 not directly vertically neighboring (e.g., in the Z-direction) one another.

An insulative material 124 may overlie the staircase structure 120 and provide electrical insulation between components thereof. The insulative material 124 may be formed of and include one or more of the materials described above with reference to the insulative structures 104. In some embodiments, the insulative material 124 comprises the same material composition as the insulative structures 104. In some embodiments, the insulative material 124 comprises silicon dioxide.

Referring to FIG. 1B and FIG. 1C, the stack structure 102 (FIG. 1B) may be partitioned in the Y-direction orthogonal to the X-direction by slot structures 125. The slot structures 125 may vertically extend (e.g., in the Z-direction) into the stack structure 102. The slot structures 125 may, for example, vertically extend completely through the stack structure 102 and to, for example, the source tier 110. The slot structures 125 may divide (e.g., in the Y-direction) the stack structure 102 into multiple block structures 128 spaced in the Y-direction. Although FIG. 1C illustrates only one block structure 128, it will be understood that the microelectronic device structure 100 may include a greater number (e.g., two (2), three (3), four (4), six (6), eight (8), ten (10), twelve (12)) of the block structures 128 horizontally spaced (e.g., in the Y-direction) from each other by a slot structure 125.

The slot structures 125 may, for example, be employed to form the conductive structures 106 (FIG. 1A, FIG. 1B) of the stack structure 102 through so-called "replacement gate" or "gate last" processing acts. For example, a preliminary stack structure may be formed to include tiers of alternating insulative structures 104 and sacrificial structures (e.g., additional insulative structures selectively etchable relative to the insulative structures 104, such as dielectric nitride structures if the insulative structures 104 comprise dielectric oxide structures). The staircase structure 120 may be formed within the preliminary stack structure. Slots (also referred to herein as "replacement gate slots") may be formed through the preliminary stack structure at locations corresponding to the locations of the slot structures 125 to extend through the insulative material 124 and the preliminary stack structure of the microelectronic device structure 100. The sacrificial structures may be selectively removed (e.g., exhumed) through the slots and spaces between vertically neighboring (e.g., in the Z-direction) insulative structures 104 may be filled with a conductive material to form the stack structure 102 including the tiers 108 of the insulative structures and the conductive structures 106. The conductive structures 106 may be located at locations corresponding to the locations of the sacrificial structures removed through the slots.

After forming the conductive structures 106, the slots may be filled with one or more materials to form the slot structures 125. In some embodiments, the slot structures 125 include a conductive material 126 and a liner material 127 horizontally neighboring the conductive material 126. The conductive material 126 may be in electrical communication with the source tier 110. In some embodiments, the conductive material 126 is formed of and includes polysilicon. The liner material 127 may electrically isolate the conductive material 126 from the conductive structures 106. The liner material 127 may comprise an insulative material, such as, for example, silicon dioxide.

With reference to FIG. 1A and FIG. 1C, each block structure 128 may include staircase regions 128a and crest regions 128b horizontally neighboring the staircase regions 128a. For example, the crest regions 128b may be located horizontally between horizontally neighboring (e.g., in the X-direction) staircase regions 128a. The crest regions 128b may comprise elevated regions (e.g., regions that do not include steps 122 or staircase structures 120 and including tiers 108 vertically higher (e.g., in the Z-direction) than the steps 122) of the horizontally neighboring staircase structures 120 within the staircase regions 128a. Although FIG. 1C illustrates only one staircase region 128a and one crest region 128b, it will be understood that each block structure 128 may include more than one staircase region 128a (e.g., more than two (2) staircase regions 128a, more than four (4) staircase regions 128a, more than six (6) staircase regions 128a, more than eight (8) staircase regions 128a, more than ten (10) staircase regions 128a, more than twelve (12) staircase regions 128a) with a crest region 128b horizontally intervening between horizontally neighboring staircase regions 128a.

With collective reference to FIG. 1A through FIG. 1C, the microelectronic device structure 100 may further include support pillar structures 130 comprising a first material 132 vertically extending through the stack structure 102 and to the source tier 110 and a liner material 134 on sidewalls of the first material 132. In some embodiments, the support pillar structures 130 within the staircase structure 120 of the staircase region 128a may terminate (e.g., land on) the second source material 114. The liner material 134 may substantially surround (e.g., substantially horizontally and vertically cover) sidewalls of the first material 132. In some embodiments, at least some of the support pillar structures 130 within the crest region 128b extends substantially through the source tier 110 and is in electrical communication with a structure (e.g., a CMOS structure) underlying the source tier 110.

The first material 132 may be formed of and include at least one conductive material, such as such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the first material 132 of each of the support pillar structures 130 has substantially the same material composition.

In other embodiments, the first material 132 is formed of and includes an insulative material. In some such embodiments, the first material 132 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first material 132 comprise $SiO_2$. In some embodiments, such as where the first material 132 comprises an insulative material, the microelectronic device structure 100 may not include the liner material 134 on sidewalls of the first material 132 and the support pillar structures 130 may comprise only the first material 132 (e.g., the insulative material).

The support pillar structures 130 may each individually exhibit a desired geometric configuration (e.g., dimensions and shape) and spacing. The geometric configurations and spacing of the support pillar structures 130 may be selected at least partially based on the configurations and positions of other components (e.g., the steps 122 of the staircase structure 120, conductive contact structures to be formed in contact with the steps 122 of the staircase structure 120, the source tier 110) of the microelectronic device structure 100. For example, the support pillar structures 130 may each individually have a geometric configuration and spacing permitting the support pillar structure 130 to vertically-extend (e.g., in the Z-direction) through the stack structure 102 and physically contact (e.g., land on) a structure of the source tier 110 to facilitate a predetermined function (e.g., an electrical interconnection function, a support function) of the support pillar structure 130. In other embodiments, the support pillar structures 130 do not include an electrical interconnection function and serve primarily (e.g., only) a support function. Each of the support pillar structures 130 may exhibit substantially the same geometric configuration (e.g., the same dimensions and the same shape) and horizontal spacing (e.g., in the X-direction) as each of the other support pillar structures 130, or at least some of the support pillar structures 130 may exhibit a different geometric configuration (e.g., one or more different dimensions, a different shape) and/or different horizontal spacing than at least some other of the support pillar structures 130. In some embodiments, the support pillar structures 130 are at least partially uniformly spaced in the X-direction and in the Y-direction. In some embodiments, the support pillar structures 130 are arranged in rows extending in the X-direction and in columns extending in the Y-direction between the slot structures 125. In other embodiments, the support pillar structures 130 are at least partially non-uniformly spaced in the X-direction. In some embodiments, each block structure 128 includes three (3) rows of the support pillar structures 130 located between horizontally neighboring slot structures 125.

The support pillar structures 130 may serve as support structures during and/or after the formation of one or more components of the microelectronic device structure 100. For example, the support pillar structures 130 may serve as support structures for the formation of the conductive structures 106 during replacement of sacrificial structures with conductive structures 106, as described above with reference to the "replacement gate" or "gate last" processing acts. The support pillar structures 130 may impede (e.g., prevent) tier collapse during the selective removal of the sacrificial structures.

The liner material 134 may be horizontally interposed between each of the first materials 132 of the support pillar structures 130 and the tiers 108 (including the insulative structures 104 and the conductive structures 106 thereof) of the stack structure 102. With reference to FIG. 1A and FIG. 1B, in some embodiments, the liner material 134 exhibits a greater dimension in the X-direction and the Y-direction at portions 133 neighboring the conductive structures 106 than along other portions of the support pillar structures 130. For example, the liner material 134 may exhibit a relatively larger dimension at the portions 133 corresponding to intersections of the conductive structures 106 and the liner material 134 of the support pillar structures 130 relative to other portions of the liner material 134.

The liner material 134 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the liner material 134 comprises Sift. In some embodiments, the liner material 134 has a different material composition as the insulative material 118. In other embodiments, the liner material 134 has the same material composition as the insulative material 118. In some embodiments, the liner material 134 comprises a material composition that is not substantially removed responsive to exposure to etch chemistries formulated and configured to remove silicon nitride.

With reference to FIG. 1B, at least some of the support pillar structures 130, such as the support pillar structures 130 within the crest region 128b may be in electrical communication with a conductive contact 116, which may be in electrical communication with a front end of the line (FEOL) structure. Although FIG. 1B illustrates that all of the support pillar structures 130 of the crest region 128b are in electrical communication with a conductive contact 116, the disclosure is not so limited and in some embodiments, at least some of the support pillar structures 130 of the crest region 128b are not in electrical communication with a conductive contact 116.

In some embodiments, conductive contact structures 136 are located centrally (in the Y-direction) between horizontally neighboring slot structures 125. In some embodiments, the conductive contact structures 136 are substantially uniformly spaced from each other in the horizontal direction (e.g., in the Y-direction). Stated another way, horizontally neighboring conductive contact structures 136 between the horizontally neighboring slot structures 125 may be substantially evenly spaced from one another. Horizontally neighboring (e.g., in the X-direction) conductive contact structures 136 may be spaced from each other by a support pillar structure 130. In some embodiments, the conductive contact structures 136 are located within the staircase regions 128a and not within the crest regions 128b.

The conductive material of the conductive contact structures 136 include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). Each of the conductive contact structures 136 may have substantially the same material composition, or at least one of the conductive contact structures 136 may have a different material composition than at least one other of the conductive contact structures 136. In some embodiments, the conductive contact structures 136 comprise titanium, titanium nitride, and tungsten. In some embodiments, the conductive contact structures 136 comprise a liner comprising titanium nitride defining external portions thereof and tungsten defining internal portions thereof.

At least some of the tiers 108 of the stack structure 102 may be coupled to at least one of the conductive contact structures 136 at one or more of the steps 122 of the staircase structure 120. Referring to FIG. 1C, in some embodiments, at least some of the conductive contact structures 136 on the steps 122 of the staircase structure 120 are horizontally-aligned (e.g., in the X-direction and in the Y-direction) with one another. For example, as shown in FIG. 1A and FIG. 1C, at least some (e.g., all) conductive contact structures 136 horizontally-neighboring one another in the X-direction (and, hence, on steps 122 at different vertical positions than one another) within the same block structure 128 may be substantially aligned with one another in the Y-direction. As another example, as also shown in FIG. 1C, at least some (e.g., all) conductive contact structures 136 horizontally-neighboring one another in the Y-direction (and, hence, on steps 122 at substantially the same vertical position as one another) may be substantially aligned with one another in the X-direction.

In some embodiments, the staircase structure 120 illustrated includes more than one conductive contact structure 136 on each step 122 and other staircase structures 120 (e.g., of other staircase regions 128a) may include only one conductive contact structure 136 on each step 122. In some embodiments, the other staircase structures 120 of other staircase regions 128a may not include conductive contact structures 136 horizontally aligned with one another in the Y-direction. In some such embodiments, the conductive contact structures 136 of such staircase structures 120 horizontally-neighboring each other in the Y-direction may be located in horizontally neighboring block structures 128. As will be described herein, the conductive structures 106 of the staircase structure 120 including more than one conductive contact structure 136 on each step 122 may be segmented into different conductive structures, by additional slot structures (so-called "SGD slot structures").

The conductive contact structures 136 may be located at least partially within horizontal boundaries (e.g., in the Y-direction) of horizontally neighboring (e.g., in the X-direction) support pillar structures 130. In some embodiments, central portions of the conductive contact structures 136 that do not horizontally neighbor the slot structures 125 may be located at least partially outside horizontal boundaries (e.g., in the Y-direction) of horizontally neighboring (e.g., in the X-direction) support pillar structures 130. In some embodiments, centers of conductive contact structures 136 horizontally neighboring the slot structures 125 may be located substantially within horizontal boundaries of horizontally neighboring (e.g., in the X-direction) support pillar structures 130.

Figure 1D:
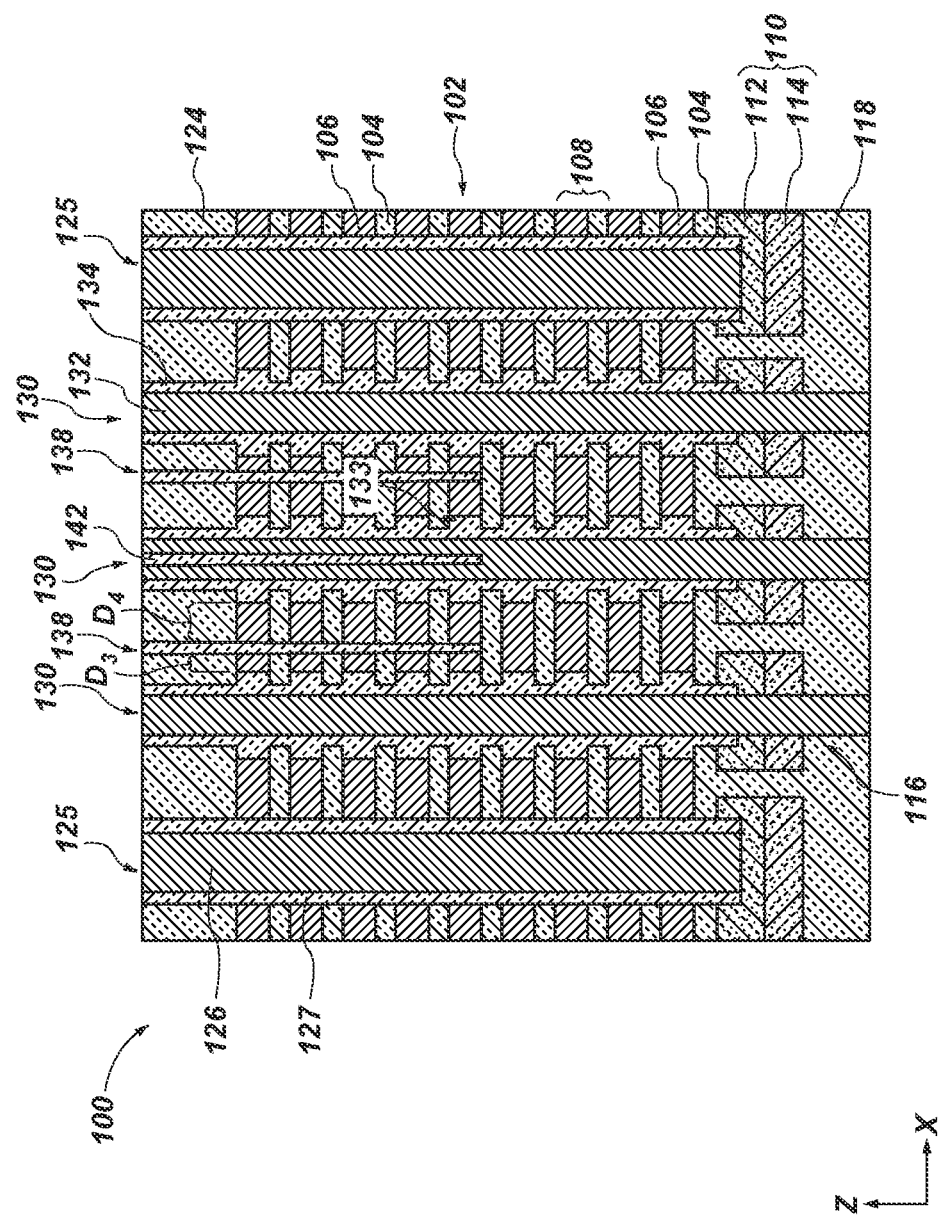
Figure 1E:
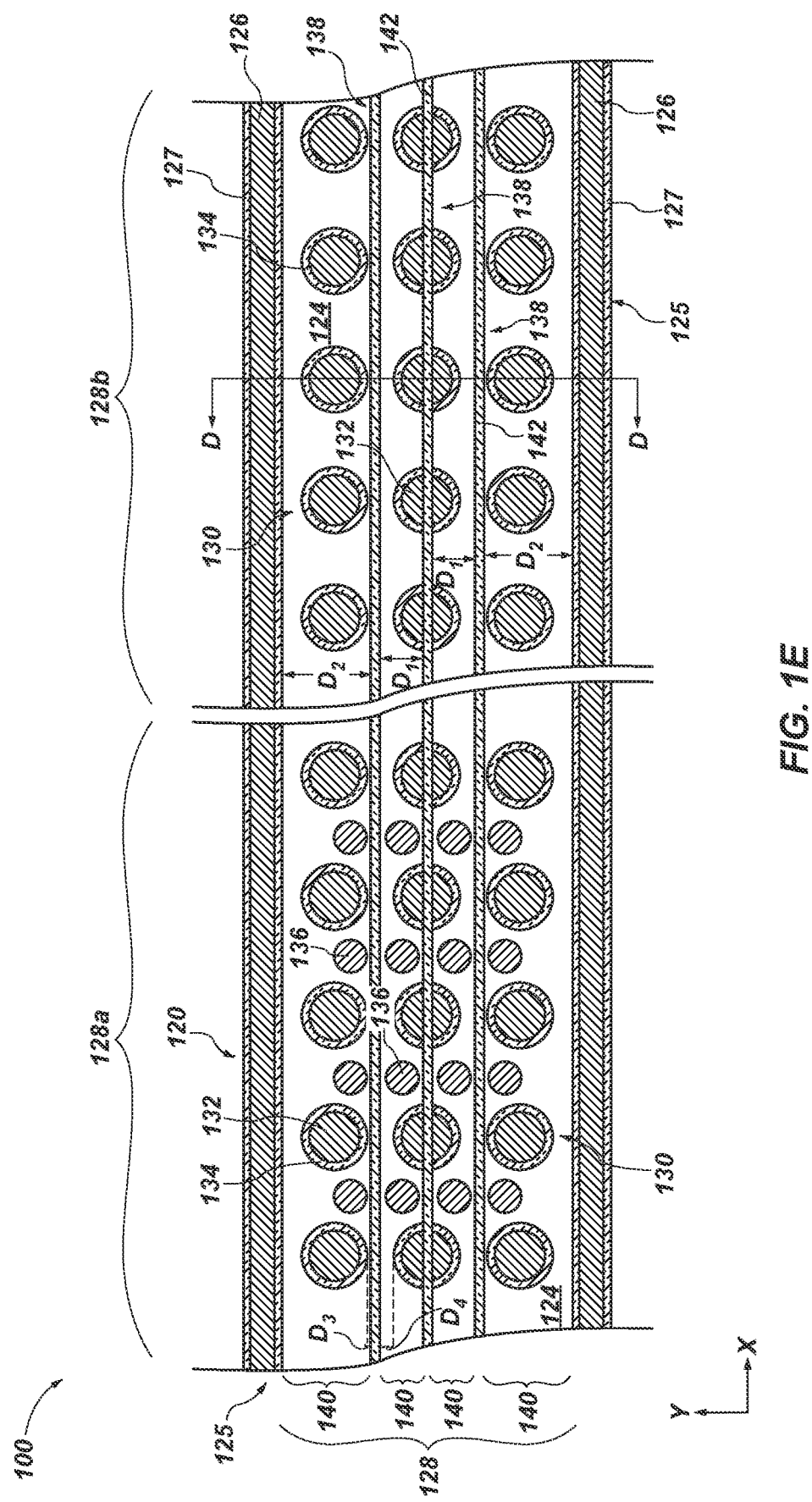

Referring now to FIG. 1D and FIG. 1E, additional slot structures 138 may be formed to extend vertically (e.g., in the Z-direction) through a portion (e.g., a vertically upper portion) of the stack structure 102. FIG. 1D is a simplified cross-sectional view of the microelectronic device structure 100 taken through section line D-D of FIG. 1E, which is a simplified top-down view of the microelectronic device structure 100. With collective reference to FIG. 1D and FIG. 1E, the additional slot structures 138 may extend in the horizontal direction (e.g., the X-direction) and may be substantially parallel with the slot structures 125. The additional slot structures 138 may be located within horizontal boundaries between horizontally neighboring (e.g., in the Y-direction) slot structures 125. In some embodiments, three (3) additional slot structures 138 may be located within the horizontal boundaries between the horizontally neighboring slot structures 125. However, the disclosure is not so limited and, in other embodiments, fewer than three (e.g., two (2), one (1)) additional slot structures 138 may be located within the horizontal boundaries between horizontally neighboring slot structures 125 or more than three (e.g., four (4), five (5), six (6)) additional slot structures 138 may be located within the horizontal boundaries between horizontally neighboring slot structures 125.

The additional slot structures 138 may define sub-block structures 140 within horizontal boundaries (e.g., in the Y-direction) of the block structures 128. In other words, the sub-block structures 140 may be located within horizontal boundaries (e.g., in the Y-direction) between horizontally neighboring additional slot structures 138. In some embodiments, the additional slot structures 138 define four (4) sub-block structures 140 located within the horizontal boundaries of the horizontally neighboring slot structures 125.

In some embodiments, the block structure 128 may include one staircase structure 120 (and one staircase region 128a) and one crest region 128b including the additional slot structures 138 and the sub-block structure 140, and may also include other staircase structures 120 (and other staircase regions 128a) and other crest regions 128b that do not include the additional slot structures 138 and the sub-block structures 140. In some such embodiments, the additional slot structures 138 extend only partially along a length (e.g., in the X-direction) of the block structure 128 and the slot structures 125.

In some embodiments, a horizontal distance $D_1$ (e.g., in the Y-direction) between horizontally neighboring additional slot structures 138 may be less than a horizontal distance D2 (e.g., in the Y-direction) between the slot structure 125 and a nearest additional slot structure 138. In some such embodiments, a width (e.g., in the Y-direction) of the sub-block structures 140 defined between horizontally neighboring additional slot structures 138 may be less than a width (e.g., in the Y-direction) between an additional slot structure 138 and a nearest slot structure 125 (e.g., a width of a sub-block structure 140 horizontally neighboring (e.g., in the Y-direction) a slot structure 125). In other words, in some embodiments, a width (e.g., in the Y-direction) of sub-block structures 140 horizontally neighboring the slot structures 125 may be greater than the width of the sub-block structures 140 that do not horizontally neighbor the slot structures 125 and are horizontally spaced from the slot structures 125 by an additional slot structure 138. Accordingly, in some embodiments, the location of the additional slot structures 138 define sub-block structures 140 having different widths.

The horizontal distance $D_1$ may be within a range from about 0.20 micrometer (μm) to about 0.60 μm, such as from about 0.20 μm to about 0.40 μm, or from about 0.40 μm to about 0.60 μm. The horizontal distance D2 may be within a range from about 0.50 μm to about 1.50 μm, such as from about 0.50 μm to about 0.75 μm, from about 0.75 μm to about 1.0 μm, from about 1.00 μm to about 1.25 μm, or from about 1.25 μm to about 1.50 μm. However, the disclosure is not so limited and each of the horizontal distance $D_1$ and the horizontal distance D2 may be different than those described.

In some embodiments, a horizontally central (e.g., in the Y-direction) additional slot structure 138 extends at least partially through some of the support pillar structures 130 (e.g., the horizontally central support pillar structures 130 between neighboring slot structures 125). In some such embodiments, each of the additional slot structures 138 may individually comprise a continuous (e.g., undivided) structure.

The additional slot structures 138 may comprise an insulative material 142. The insulative material 142 may include one or more of the materials described above with reference to the insulative structures 104. In some embodiments, the insulative material 142 comprises substantially the same material composition as the insulative structures 104. In some embodiments, the insulative material 142 comprises silicon dioxide.

The additional slot structures 138 may be formed by forming trenches within upper portions of the stack structure 102. For example, the trenches may be formed to extend vertically (e.g., in the Z-direction) through a desired number of tiers 108. Although FIG. 1D illustrates that the additional slot structures 138 extend through five (5) of the tiers 108, the disclosure is not so limited. In other embodiments, the additional slot structures 138 extend through a greater number of the tiers 108 (e.g., more than six (6) of the tiers 108, more than eight (8) of the tiers 108, more than ten (10) of the tiers 108). In other embodiments, the additional slot structures 138 extend through fewer of the tiers 108 (e.g., fewer than five (5) of the tiers 108, fewer than four (4) of the tiers 108). After forming the trenches, the trenches may be filled with the insulative material 142 to form the additional slot structure 138. In some embodiments, the additional slot structures 138 are formed at substantially the same time as the slot structures 125.

With combined reference to FIG. 1D and FIG. 1E, a horizontal distance $D_3$ (e.g., in the Y-direction) between an additional slot structure 138 horizontally neighboring a slot structure 125 (e.g., an additional slot structure 138 nearest a slot structure 125) and a horizontally neighboring (e.g., in the Y-direction) support pillar structure 130 in a direction of the slot structure 125 may be less than a horizontal distance $D_4$ (e.g., in the Y-direction) between the additional slot structure 138 and an additional horizontally neighboring support pillar structure 130 in a direction away from the slot structure 125. For example, in some embodiments, the horizontal distance $D_3$ between the additional slot structure 138 and a horizontally neighboring support pillar structure 130 in a direction of the slot structure 125 may be less than the horizontal distance $D_4$ between the additional slot structure 138 and another horizontally neighboring support pillar structure 130 in a direction away from the slot structure 125.

The location of the support pillar structures 130 in the crest region 128b and the location of the additional slot structures 138 may provide an increased margin for forming the support pillar structures 130 and the additional slot structures 138 while maintaining electrical continuity of the conductive structures 106 through which the additional slot structures 138 extend. In other words, the larger horizontal distance $D_4$ (relative to the horizontal distance $D_3$) may facilitate a reduction in the width (e.g., in the Y-direction) of the block structure 128 while facilitating sufficient area for formation of the support pillar structures 130 and the additional slot structures 138 without breaking the continuity of the conductive structures 106 such that the conductive structures 106 are in electrical communication with the conductive contact structures 136.

Figure 1F:
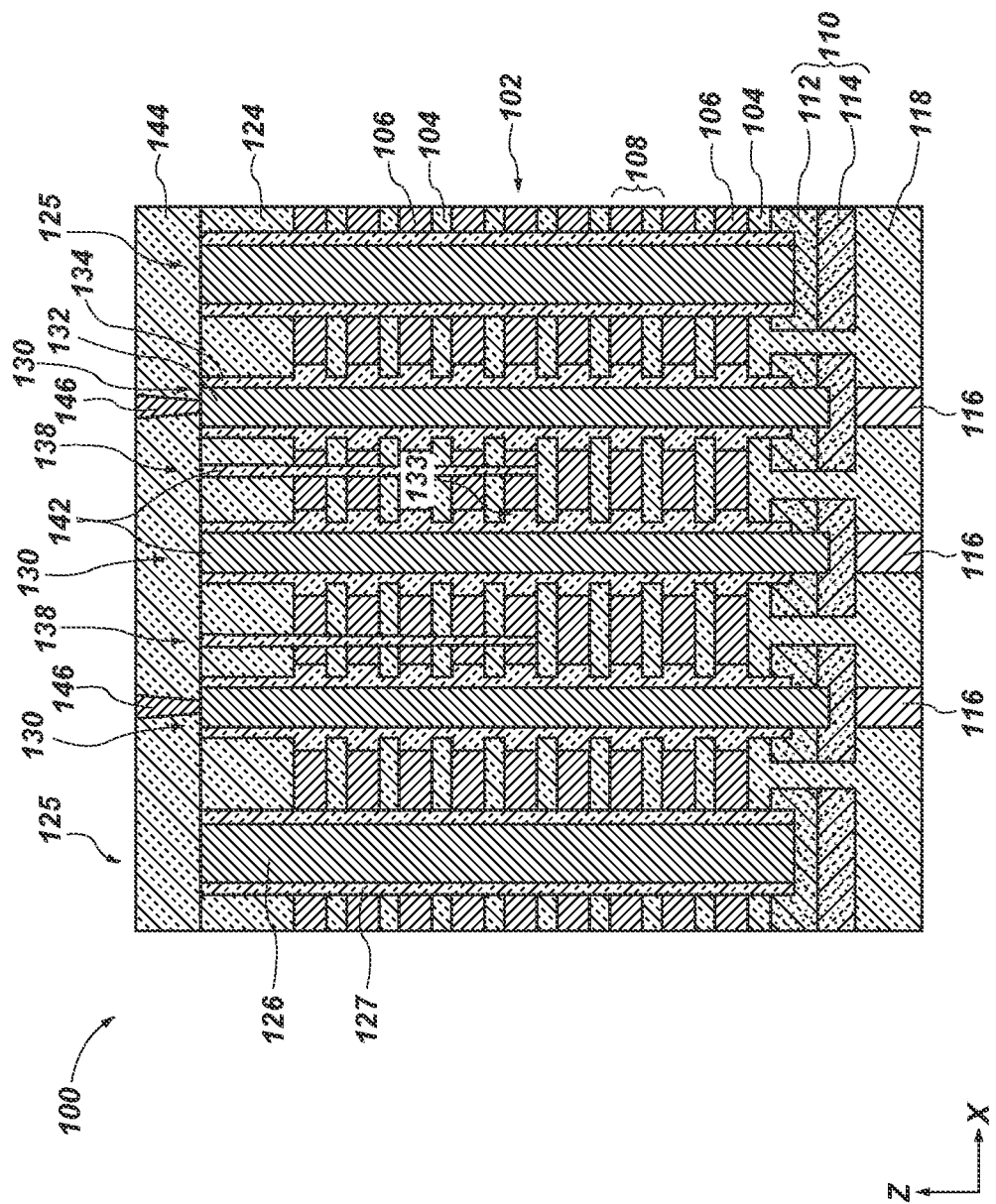
Figure 1G:
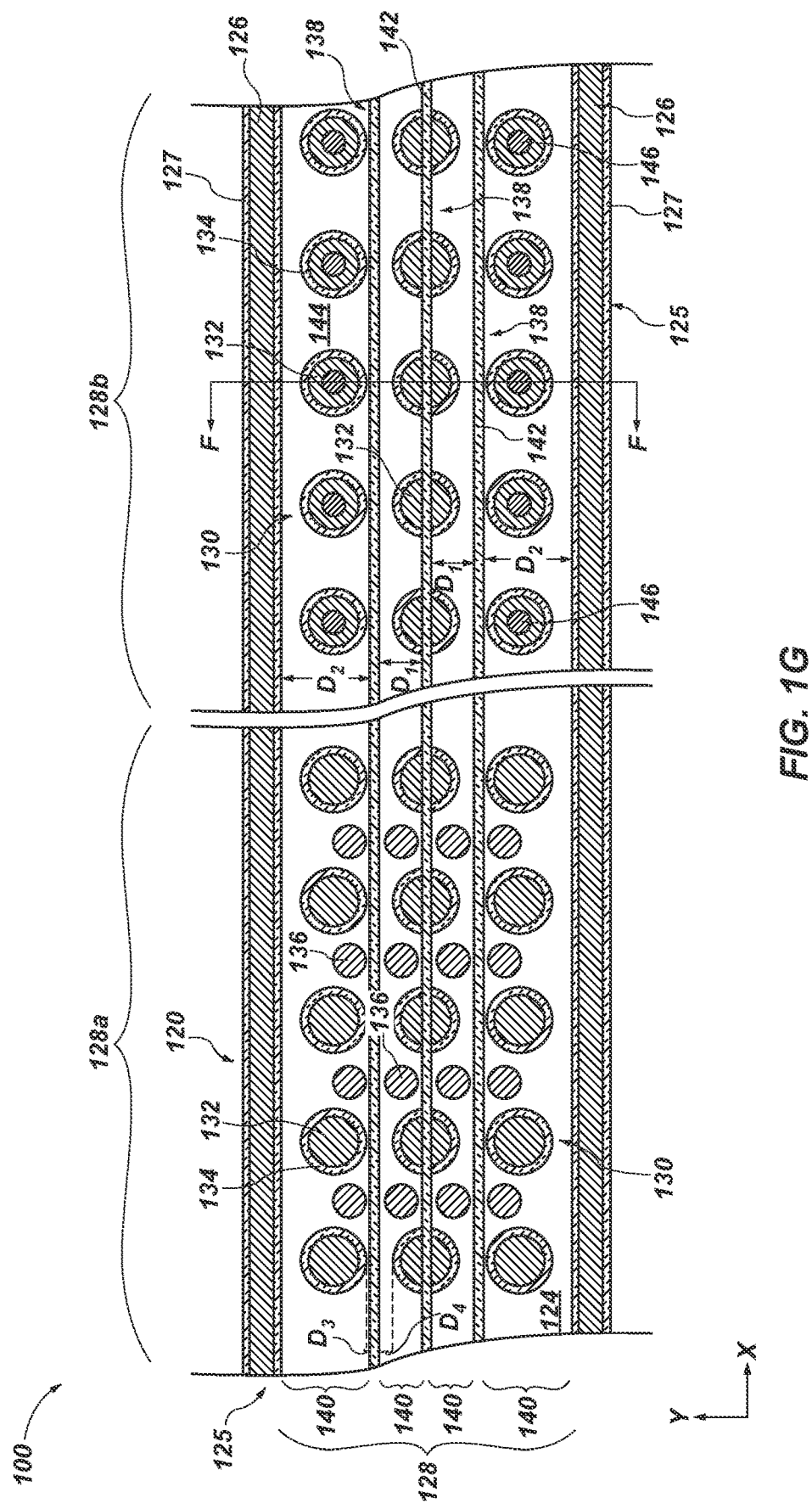

Referring now to FIG. 1F and FIG. 1G, conductive contacts 146 may be formed in electrical communication with some of the support pillar structures 130. FIG. 1F is a simplified cross-sectional view of the microelectronic device structure 100 taken through section line F-F of FIG. 1G, which is a simplified top-down view of the microelectronic device structure 100.

With reference to FIG. 1F, an insulative material 144 may be formed on or over exposed surface of the microelectronic device structure 100. The insulative material 144 may include one or more of the materials described above with reference to the insulative structures 104. In some embodiments, the insulative material 144 comprises substantially the same material composition as the insulative structures 104. In some embodiments, the insulative material 144 comprises silicon dioxide.

Openings may be formed in the insulative material 144 to expose at least a portion (e.g., at least a portion of the first material 132) of some of the support pillar structures 130. For example, the first material 132 of the support pillar structures 130 may be exposed through the openings in the insulative material 144. The openings may be filled with a conductive material to form the conductive contacts 146. In some embodiments, the conductive contacts 146 are formed of and include tungsten.

In some embodiments, rows of the support pillar structures 130 horizontally neighboring (e.g., nearest) the slot structures 125 may include the conductive contacts 146 and may be referred to herein as "conductive pillar structures." Support pillar structures 130 located within a horizontally central row of the support pillar structures 130 may not include the conductive contacts 146.

The conductive contacts 146 may be electrically coupled to routing structures that are, in turn, electrically coupled to front end of the line (FEOL) metallization structures.

Accordingly, in some embodiments, formation of the additional slot structures 138 spaced from one another within the block structure 128 and the spacing and orientation of the support pillar structures 130 may facilitate a reduction in a size (e.g., a horizontal width) of the block structures 128. The reduced size of the block structures 128 may facilitate an increased density of the components of the microelectronic device structure 100 and of associated strings of memory cells (e.g., vertical strings 307 (FIG. 3) of memory cells 303 (FIG. 3)).

Although FIG. 1A through FIG. 1G have been described and illustrated as including a particular configuration of the additional slot structures 138 within the block structures 128, the disclosure is not so limited. FIG. 2A through FIG. 2D illustrate a method of forming a microelectronic device structure 200, in accordance with embodiments of the disclosure.

Figure 2A:
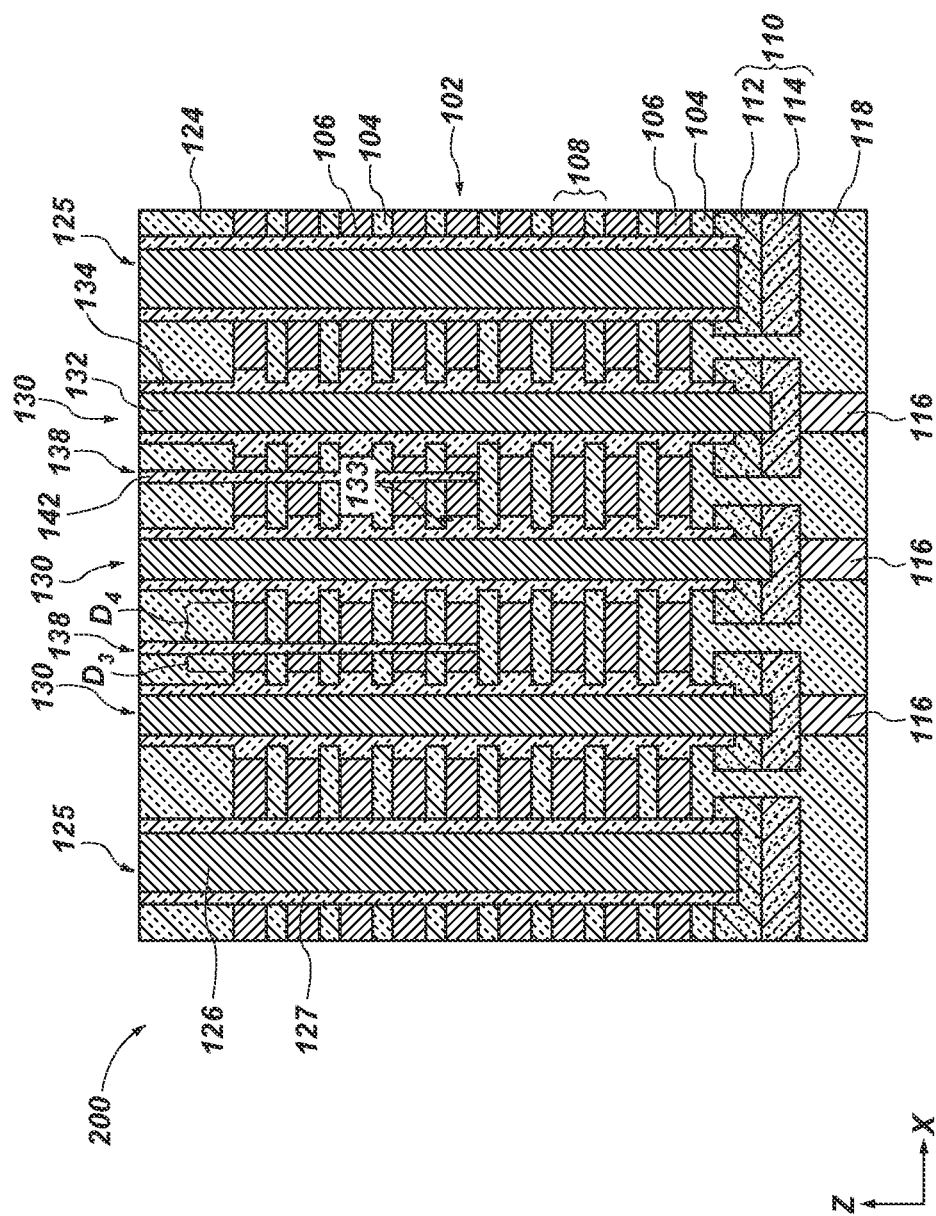
FIG. 2A through FIG. 2D are simplified cross-sectional views (FIG. 2A and FIG. 2C) and top-down views (FIG. 2B and FIG. 2D) illustrating a method of forming a microelectronic device, in accordance with other embodiments of the disclosure.
Figure 2B:
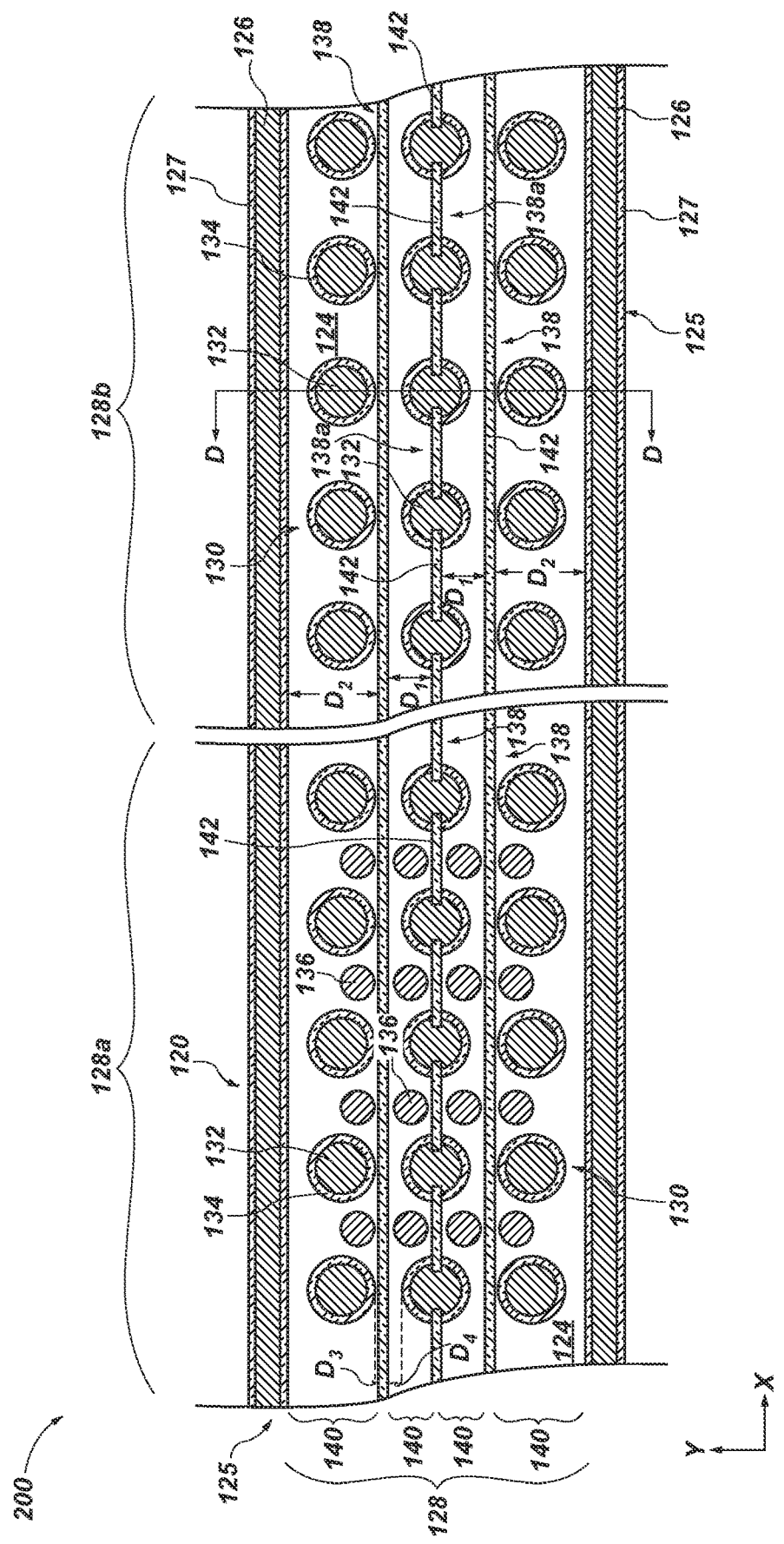

FIG. 2A is a simplified cross-sectional view of the microelectronic device structure 200 and FIG. 2B is a simplified top-down view of the microelectronic device structure 200. FIG. 2A is a cross-section of the microelectronic device structure 200 of FIG. 2B taken through section line A-A of FIG. 2B. The microelectronic device structure 200 may be substantially similar to the microelectronic device structure of FIG. 1D and FIG. 1E, except that one or more of the additional slot structures 138 may comprise a segmented (e.g., discontinuous) structure.

Referring to FIG. 2B, in some embodiments, a horizontally central additional slot structure 138 (e.g., an additional slot structure 138 located horizontally between two other additional slot structures 138) may comprise a segmented structure including segmented portions 138a extending horizontally (e.g., in the X-direction) and substantially parallel to horizontally neighboring additional slot structures 138. In some such embodiments, the segmented portions 138a of the additional slot structure 138 may not extend through the support pillar structure 130. For example, the segmented portions 138a may extend at least partially into (e.g., substantially through, completely through) the liner material 134 and, in some embodiments, may extend partially into the first material 132. In some such embodiments, the first material 132 may separate horizontally neighboring (e.g., in the X-direction) segmented portions 138a of the additional slot structure 138.

Although FIG. 2B has been described and illustrated as including the segmented portions 138a of the additional slot structure 138 extending through a portion of the first material 132 and through the liner material 134 of the support pillar structures 130, the disclosure is not so limited. In other embodiments, the segmented portions 138a may not extend through portions of the first material 132. In some such embodiments, the segmented portions 138a may extend partially through the liner material 134 or may not extend partially through the segmented portions 138a (e.g., and may terminated at the liner material 134).

Figure 2C:
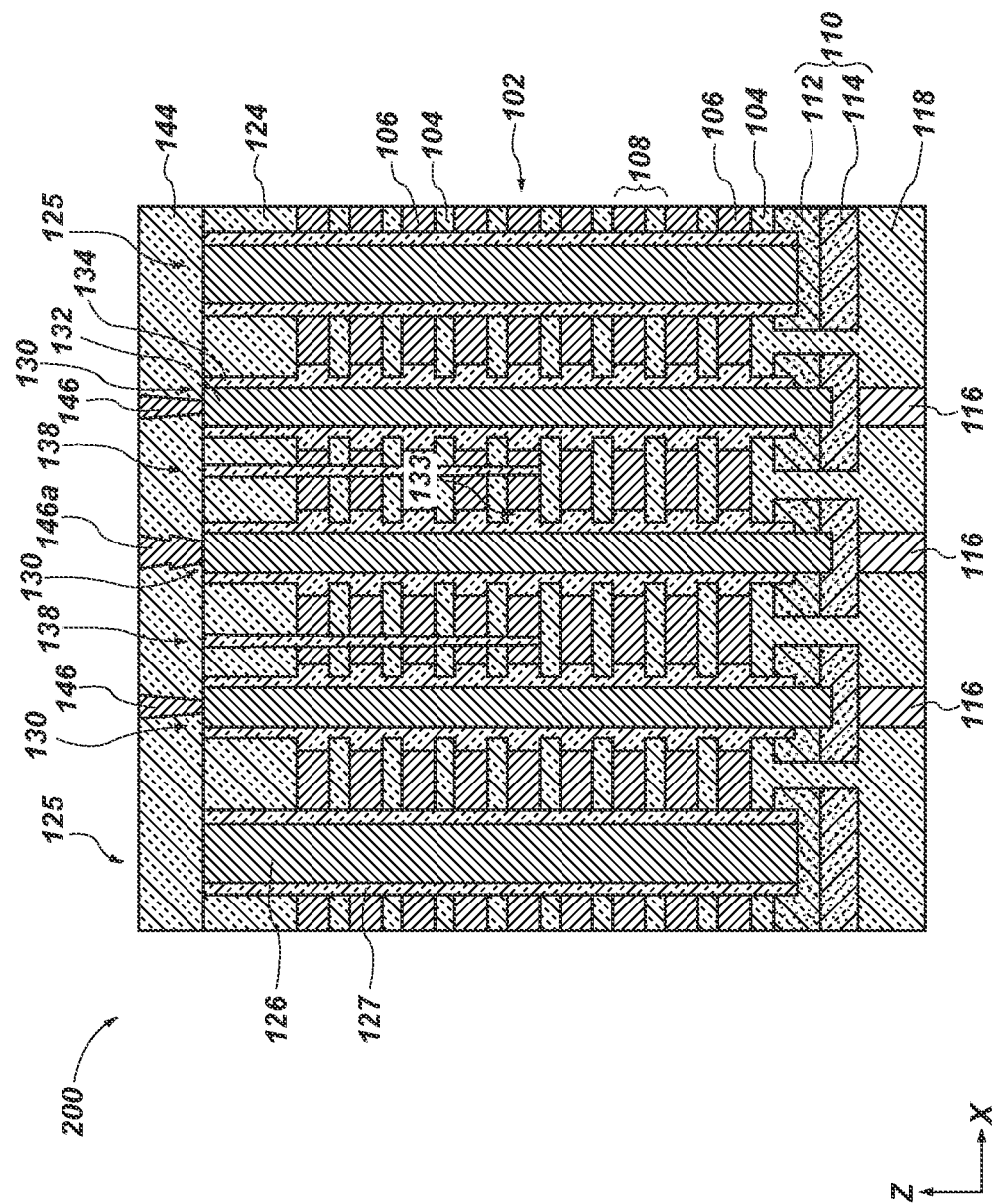
Figure 2D:
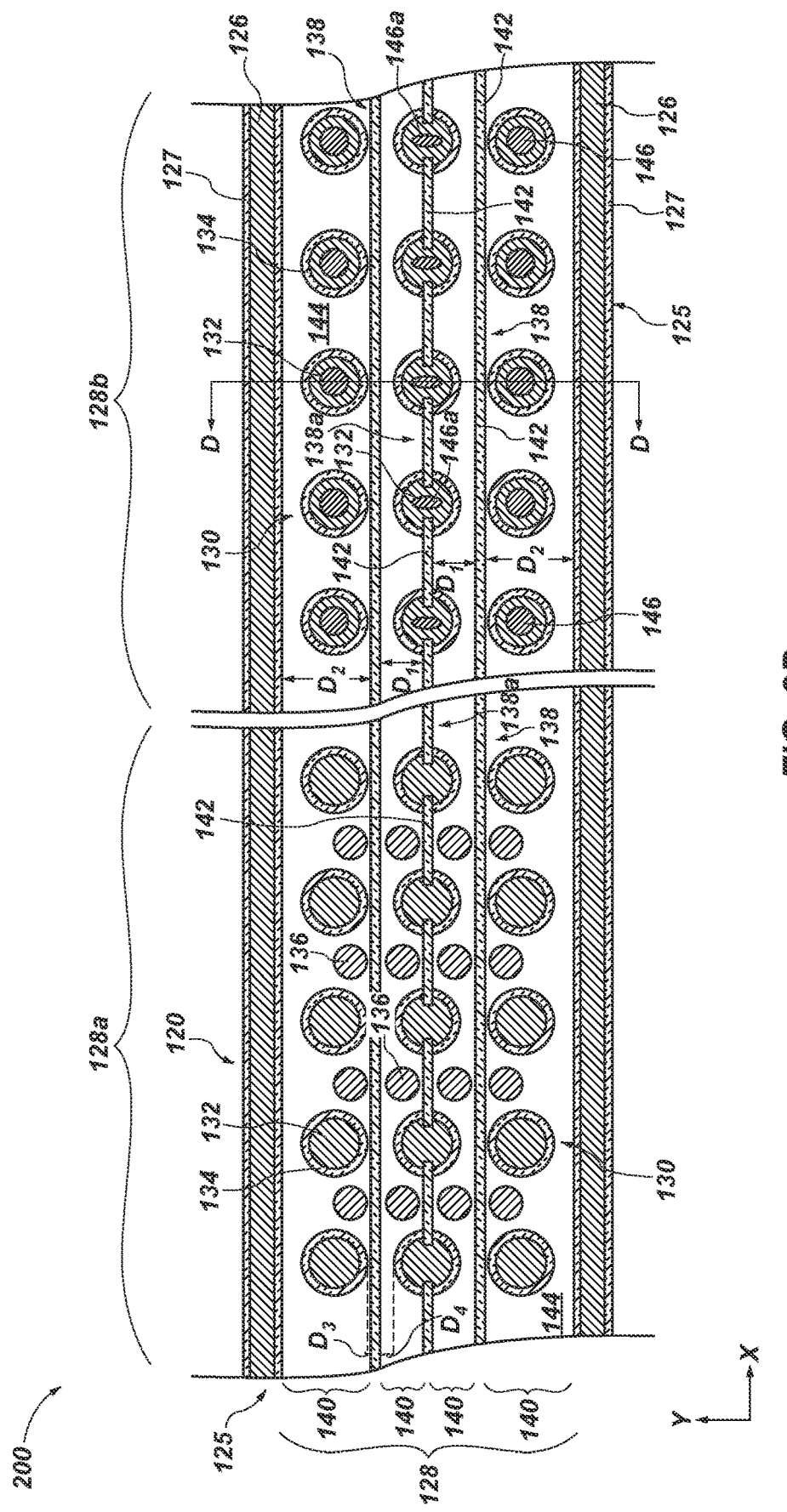

Referring now to FIG. 2C and FIG. 2D, conductive contacts 146 may be formed over and in electrical communication with the support pillar structures 130. The conductive contacts 146 may be formed in substantially the same manner as described above with reference to FIG. 2F and FIG. 2G. In some embodiments, conductive contacts 146a horizontally neighboring (e.g., in the X-direction) the segmented portions 138a of the additional slot structure 138 may exhibit an elongated shape and may be referred to herein as "elongated conductive contacts." In some embodiments, the elongated conductive contacts 146a may exhibit an elliptical cross-sectional shape. In other embodiments, the elongated conductive contacts 146a exhibit a rectangular cross-sectional shape. The elongated shape of the elongated conductive contacts 146a may facilitate maintaining a sufficient spacing between the elongated conductive contacts 146a and the segmented portions 138a of the additional slot structure 138.

Forming the microelectronic device structure 200 to include the segmented portions 138a of the additional slot structure 138 may facilitate forming conductive contacts 146 on substantially all of the support pillar structures 130 within the crest region 128b of the microelectronic device structure 200. By way of contrast, the microelectronic device structure 100 of FIG. 1G may not include conductive contacts 146 in electrical communication with the support pillar structures 130 intersected by an additional slot structure 138. Accordingly, in some embodiments, all of the support pillar structures 130 may comprise conductive pillar structures. In some such embodiments, a size (e.g., a length (e.g., in the X-direction)) of the crest regions 128b may be decreased, facilitate a reduction in the area of the block structure 128 and the microelectronic device structure 100.

Figure 3:
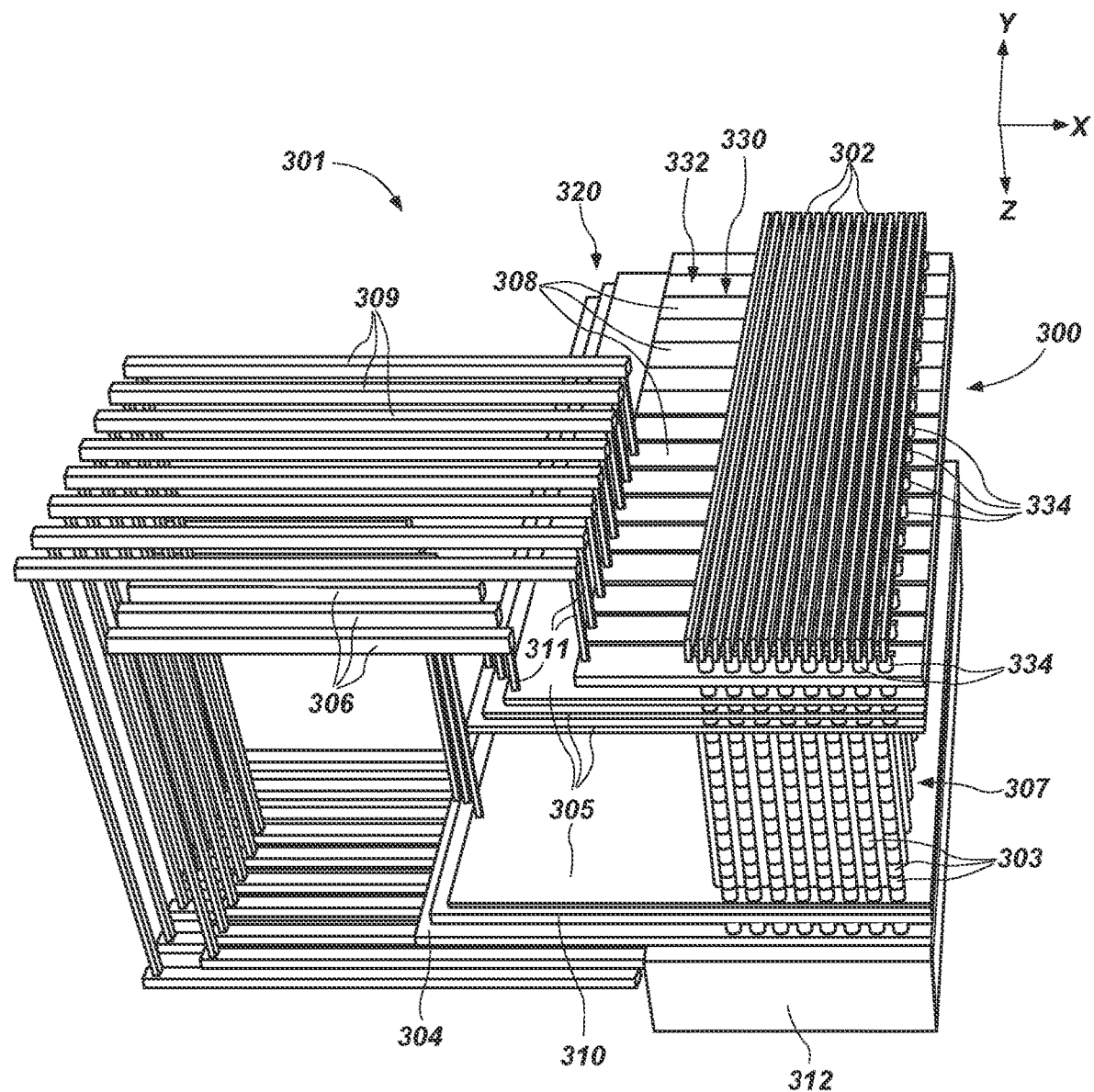
FIG. 3 is a partial cutaway perspective view of a microelectronic device, in accordance with embodiments of the disclosure.

FIG. 3 illustrates a partial cutaway perspective view of a portion of a microelectronic device 301 (e.g., a memory device, such as a dual deck 3D NAND Flash memory device) including a microelectronic device structure 300. The microelectronic device structure 300 may be substantially similar to the microelectronic device structures 100, 200 following the processing stages previously described with reference to FIG. 1F and FIG. 1G and with reference to FIG. 2C and FIG. 2D. As shown in FIG. 3, the microelectronic device structure 300 may include a staircase structure 320 (e.g., including the staircase structures 120 (FIG. 1A)) defining contact regions for connecting access lines 306 to conductive tiers 305 (e.g., conductive layers, conductive plates, such as the conductive structures 106 (FIG. 1F, FIG. 2C)). The microelectronic device structure 300 may include vertical strings 307 of memory cells 303 that are coupled to each other in series. The vertical strings 307 may extend vertically (e.g., in the Z-direction) and orthogonally to conductive lines and tiers 305, such as data lines 302, a source tier 304 (e.g., the source tier 110 (FIG. 1F, FIG. 2C)), the conductive tiers 305, the access lines 306, first select gates 308 (e.g., upper select gates, drain select gates (SGDs)), select lines 309, and a second select gate 310 (e.g., a lower select gate, a source select gate (SGS)). The select gates 308 may be horizontally divided (e.g., in the Y-direction) into multiple block structures 332 (e.g., block structures 128 (FIG. 1G, FIG. 2D)) and sub-blocks (e.g., sub-block structures 140 (FIG. 1G, FIG. 2D)) horizontally separated (e.g., in the Y-direction) from one another by slot structures 330 (e.g., slot structures 125 (FIG. 1I, FIG. 2D) and additional slot structures 138 (FIG. 1G, FIG. 2D)).

Vertical conductive contacts 311 (e.g., conductive contact structures 136 (FIG. 1G, FIG. 2D)) may electrically couple components to each other as shown. For example, the select lines 309 may be electrically coupled to the first select gates 308 and the access lines 306 may be electrically coupled to the conductive tiers 305. The microelectronic device 301 may also include a control unit 312 positioned under the memory array, which may include control logic devices configured to control various operations of other features (e.g., the strings 307 of memory cells 303) of the microelectronic device 301. By way of non-limiting example, the control unit 312 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 312 may be electrically coupled to the data lines 302, the source tier 304, the access lines 306, the first select gates 308, and the second select gates 310, for example. In some embodiments, the control unit 312 includes CMOS (complementary metal-oxide-semiconductor) circuitry. In such embodiments, the control unit 312 may be characterized as having a "CMOS under Array" ("CuA") configuration.

The first select gates 308 may extend horizontally in a first direction (e.g., the X-direction) and may be coupled to respective first groups of vertical strings 307 of memory cells 303 at a first end (e.g., an upper end) of the vertical strings 307. The second select gate 310 may be formed in a substantially planar configuration and may be coupled to the vertical strings 307 at a second, opposite end (e.g., a lower end) of the vertical strings 307 of memory cells 303.

The data lines 302 (e.g., bit lines) may extend horizontally in a second direction (e.g., in the Y-direction) that is at an angle (e.g., perpendicular) to the first direction in which the first select gates 308 extend. The data lines 302 may be coupled to respective second groups of the vertical strings 307 at the first end (e.g., the upper end) of the vertical strings 307. A first group of vertical strings 307 coupled to a respective first select gate 308 may share a particular vertical string 307 with a second group of vertical strings 307 coupled to a respective data line 302. Thus, a particular vertical string 307 may be selected at an intersection of a particular first select gate 308 and a particular data line 302. Accordingly, the first select gates 308 may be used for selecting memory cells 303 of the strings 307 of memory cells 303.

The conductive tiers 305 may extend in respective horizontal planes. The conductive tiers 305 may be stacked vertically, such that each conductive tier 305 is coupled to all of the vertical strings 307 of memory cells 303, and the vertical strings 307 of the memory cells 303 extend vertically through the stack of conductive tiers 305. The conductive tiers 305 may be coupled to or may form control gates of the memory cells 303 to which the conductive tiers 305 are coupled. Each conductive tier 305 may be coupled to one memory cell 303 of a particular vertical string 307 of memory cells 303.

The staircase structure 320 may be configured to provide electrical connection between the access lines 306 and the tiers 305 through the vertical conductive contacts 311. In other words, a particular level of the tiers 305 may be selected via an access line 306 in electrical communication with a respective conductive contact 311 in electrical communication with the particular tier 305.

The data lines 302 may be electrically coupled to the vertical strings 307 through conductive contact structures 334.

As described above, with reference to the microelectronic device structure 100, 200, the spacing of the slot structures 330 (including the additional slot structures 138 (FIG. 1G, FIG. 2D)) may facilitate forming the block structures 332 to exhibit a relatively reduced width compared to conventional microelectronic devices. In some embodiments, the spacing of the slot structures 330 facilitates fabrication of microelectronic device structures having a greater density of vertical strings 307 of memory cells 303.

Figure 4:
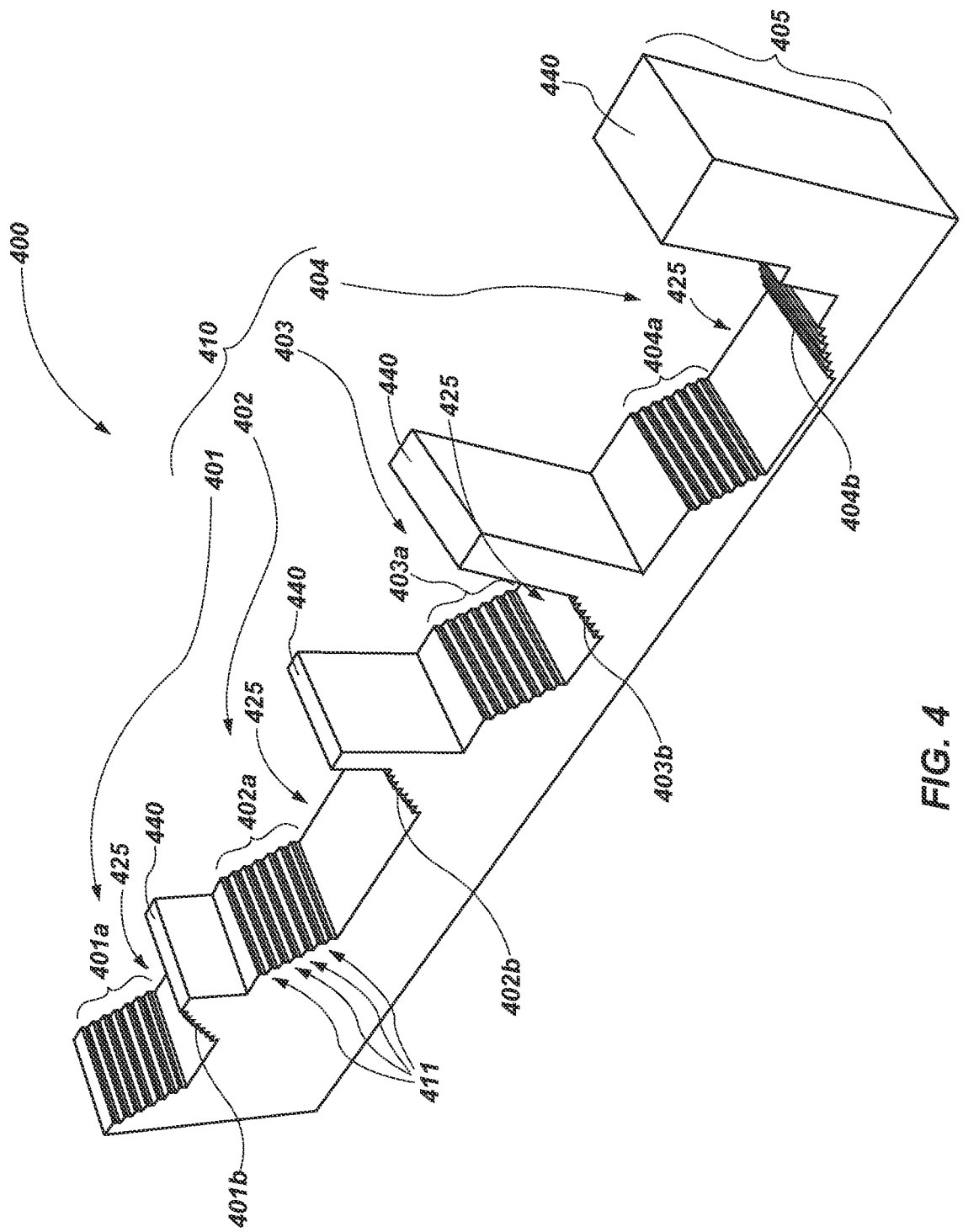
FIG. 4 is a simplified perspective view of a microelectronic device structure of the microelectronic device shown in FIG. 3, in accordance with embodiments of the disclosure.

FIG. 4 is a simplified perspective view of a microelectronic device structure 400, in accordance with embodiments of the disclosure. The microelectronic device structure 400 may, for example, be employed as the microelectronic device structure 300 of the microelectronic device 301 previously described with reference to FIG. 3 or the microelectronic device structures 100, 200 previously described with reference to FIG. 1F and FIG. 1G or FIG. 2C and FIG. 2D. As shown in FIG. 4, the microelectronic device structure 400 may include a stack structure 405 (e.g., stack structure 102 (FIG. 1F, FIG. 2C)) of vertically alternating conductive structures and insulative structures. The microelectronic device structure 400 may include one or more staircase structures 410 (e.g., staircase structures 120 (FIG. 1A) or staircase structures 320 (FIG. 3)). Steps 411 of the staircase structure(s) 410 of the microelectronic device structure 400 may serve as contact regions for different tiers (e.g., conductive tiers 305 (FIG. 3)) of conductive materials (e.g., conductive structures 106 (FIG. 1F, FIG. 2D)) of the stack structure 405. The steps 411 may be located at horizontal ends of conductive structures (e.g., the conductive tiers 305) and insulative structures located between neighboring conductive structures.

The staircase structure(s) 410 may include, for example, a first stadium structure 401, a second stadium structure 402, a third stadium structure 403, and a fourth stadium structure 404. Each of the first stadium structure 401, the second stadium structure 402, the third stadium structure 403, and the fourth stadium structure 404 may include steps 411 at different elevations (e.g., vertical positions) relative to steps 411 of the other of the first stadium structure 401, the second stadium structure 402, the third stadium structure 403, and the fourth stadium structure 404. The first stadium structure 401 may include a first stair step structure 401a and an additional first stair step structure 401b; the second stadium structure 402 may include a second stair step structure 402a and an additional second stair step structure 402b; the third stadium structure 403 may include a third stair step structure 403a and an additional third stair step structure 403b; and the fourth stadium structure 404 may include a fourth stair step structure 404a and an additional fourth stair step structure 404b. The first stair step structure 401a, the second stair step structure 402a, the third stair step structure 403a, and the fourth stair step structure 404a may include steps 411 opposing and at the same elevation as the respective additional first stair step structure 401b, the additional second stair step structure 402b, the additional third stair step structure 403b, and the additional fourth stair step structure 404b. Each of the first stair step structure 401a, the second stair step structure 402a, the third stair step structure 403a, and the fourth stair step structure 404a may individually exhibit a generally negative slope; and each of the additional first stair step structure 401b, the additional second stair step structure 402b, the additional third stair step structure 403b, and the additional fourth stair step structure 404b may individually exhibit a generally positive slope.

As shown in FIG. 4, a valley 425 may be located between the first stair step structure 401a and the additional first stair step structure 401b; between the second stair step structure 402a and the additional second stair step structure 402b; between the third stair step structure 403a and the additional third stair step structure 403b; and between the fourth stair step structure 404a and the additional fourth stair step structure 404b.

A region between neighboring stadium structures (e.g., the first stadium structure 401, the second stadium structure 402, the third stadium structure 403, and the fourth stadium structure 404) may comprise an elevated region 440 (e.g., crest regions 128b (FIG. 1G, FIG. 2D)).

As described above, conductive contact structures (e.g., the conductive contact structures 136 (FIG. 1G, FIG. 2D), vertical conductive contacts 311 (FIG. 3)) may be formed to the electrically conductive portion of each tier (e.g., each step 411) of the stack structure 405 of the microelectronic device structure 400. In some embodiments, one or more of the stadium structures 401, 402, 403, 404 may include an additional slot structure (e.g., additional slot structure 138, 138a (FIG. 1G, FIG. 2D)) between slot structures. In some embodiments, only one of the stadium structures 401, 402, 403, 404 includes the additional slot structures and the other stadium structures 401, 402, 403, 404 include only slot structures. In some embodiments, a stadium structure having vertically higher (e.g., in the Z-direction) steps 411 (e.g., the stadium structure 401) may correspond to the staircase region 128a (FIG. 1G, FIG. 2D) including the additional slot structures 138 (FIG. 1G, FIG. 2D) while the other stadium structures may correspond to other staircase regions 128a not including the additional slot structures 138.

As will be understood by those of ordinary skill in the art, although the microelectronic device structure 200 (FIG. 3) and the microelectronic device structure 400 (FIG. 4) have been described as having particular structures, the disclosure is not so limited and the microelectronic device structures 300, 400 may have different geometric configurations and orientations.

Thus, in accordance with embodiments of the disclosure a microelectronic device comprises a stack structure comprising a vertically alternating sequence of conductive structures and insulative structures arranged in tiers, the stack structure divided into block structures separated from one another by slot structures, a staircase structure within the stack structure having steps comprising horizontal edges of the tiers, conductive contact structures in contact with the steps of the staircase structure, support pillar structures extending through the stack structure, and additional slot structures extending partially through the stack structure within one of the block structures, one of the additional slot structures extending between horizontally neighboring support pillar structures and located closer to one of the horizontally neighboring support pillar structures than to an additional one of the horizontally neighboring support pillar structures.

Thus, in accordance with additional embodiments of the disclosure, a microelectronic device comprises a stack structure comprising alternating conductive structures and insulative structures arranged in tiers, a staircase structure within the stack structure and having steps comprising horizontal ends of the tiers, slot structures vertically extending through the stack structure and extending in a first horizontal direction, additional slot structures extending in the first horizontal direction between slot structures neighboring each other in a second horizontal direction, and support pillar structures vertically extending through the stack structure and arranged in rows, one of the rows of the support pillar structures at least partially intersected by one of the additional slot structures.

Thus in accordance with further embodiments of the disclosure, a memory device comprises a stack structure comprising a vertically alternating sequence of conductive structures and insulative structures arranged in tiers, the stack structure divided into block structures separated from one another by slot structures, strings of memory cells vertically extending through the stack structure, additional slot structures within horizontally boundaries of a block structure and extending substantially parallel to the slot structures, the additional slot structures dividing the block structure into sub-block structures, one or more of the sub-block structures having a different width than one or more of the other sub-block structures, and support pillar structures arranged in rows within each of the sub-block structures.

Figure 5:
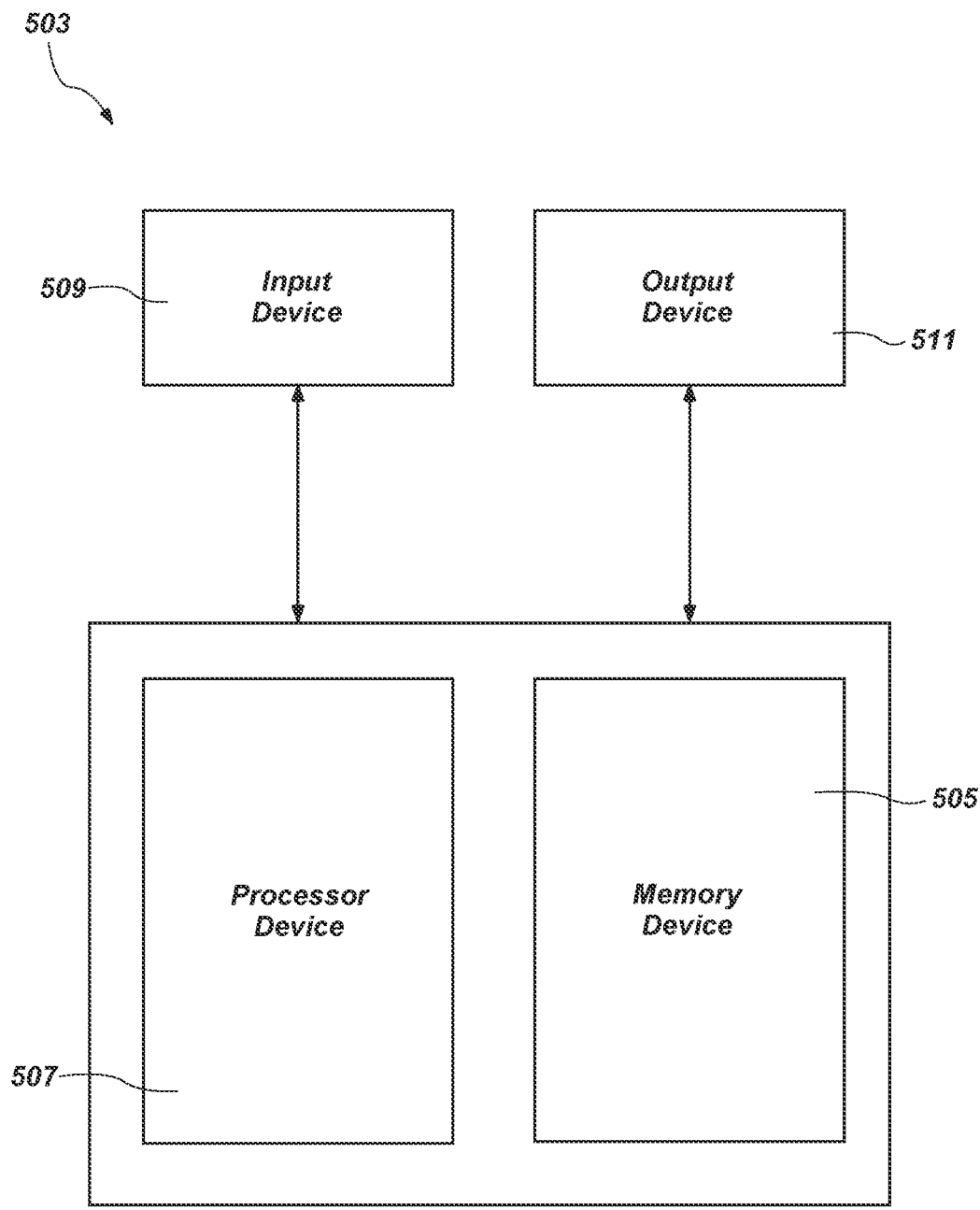
FIG. 5 is a block diagram of an electronic system, in accordance with embodiments of the disclosure.

Microelectronic devices (e.g., the microelectronic device 301 (FIG. 3)) and microelectronic device structures (e.g., the microelectronic device structures 100, 200, 300, 400) of the disclosures may be included in embodiments of electronic systems of the disclosure. For example, FIG. 5 is a block diagram of an electronic system 503, in accordance with embodiments of the disclosure. The electronic system 503 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 503 includes at least one memory device 505. The memory device 505 may include, for example, an embodiment one or more of a microelectronic device structure herein (e.g., the microelectronic device structure 100, 200, 300, 400) and a microelectronic device (e.g., the microelectronic device 301) previously described herein.

The electronic system 503 may further include at least one electronic signal processor device 507 (often referred to as a "microprocessor"). The electronic signal processor device 507 may, optionally, include an embodiment of one or more of a microelectronic device and a microelectronic device structure previously described herein. The electronic system 503 may further include one or more input devices 509 for inputting information into the electronic system 503 by a user, such as, for example, a mouse or other pointing device, a keyboard, a touchpad, a button, or a control panel. The electronic system 503 may further include one or more output devices 511 for outputting information (e.g., visual or audio output) to a user such as, for example, a monitor, a display, a printer, an audio output jack, a speaker, etc. In some embodiments, the input device 509 and the output device 511 may comprise a single touchscreen device that can be used both to input information to the electronic system 503 and to output visual information to a user. The input device 509 and the output device 511 may communicate electrically with one or more of the memory device 505 and the electronic signal processor device 507.

Figure 6:
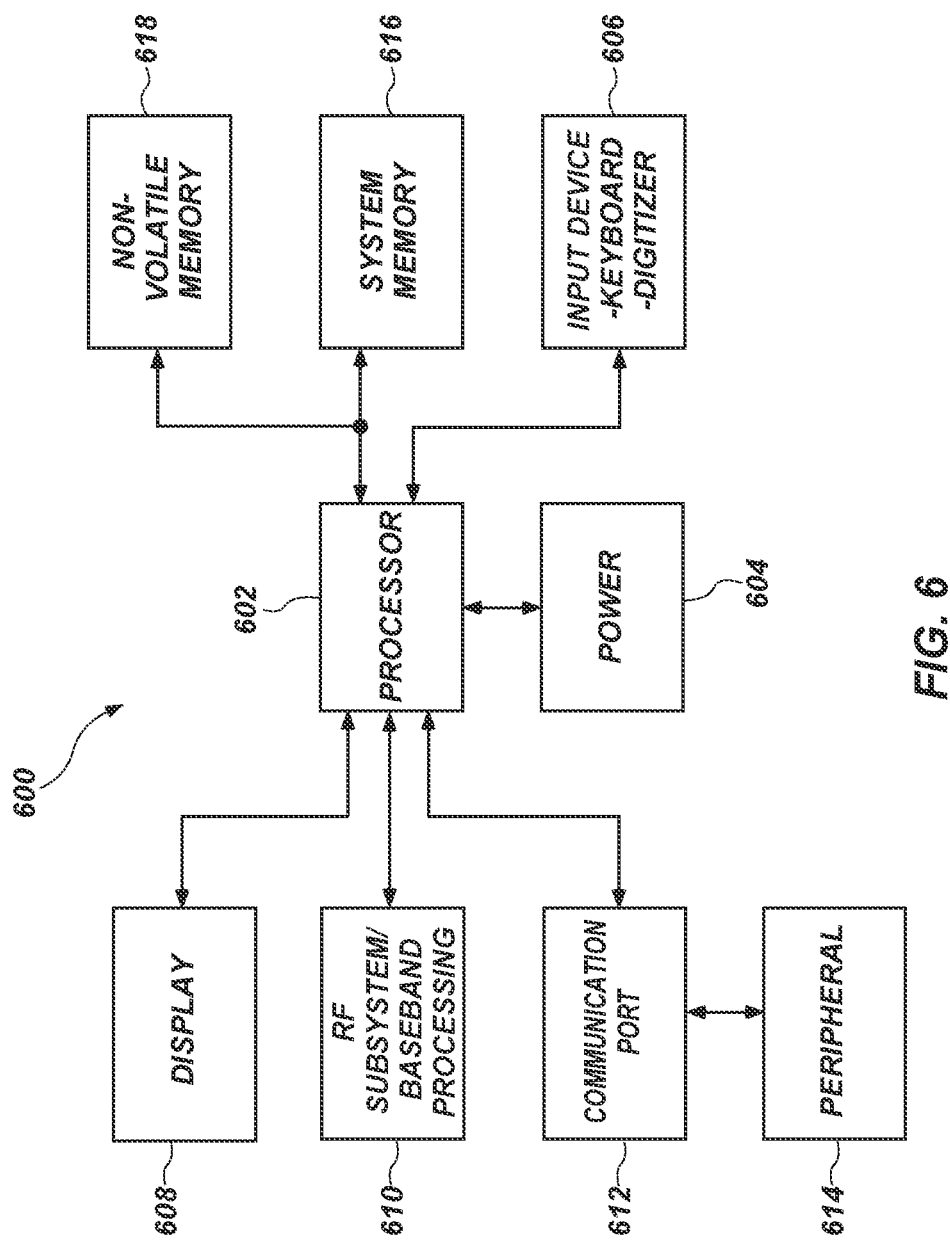
FIG. 6 is a block diagram of a processor-based system, in accordance with embodiments of the disclosure.

With reference to FIG. 6, depicted is a processor-based system 600. The processor-based system 600 may include one or more of a microelectronic device and a microelectronic device structure previously described herein and manufactured in accordance with embodiments of the disclosure. The processor-based system 600 may be any of a variety of types such as a computer, pager, cellular phone, personal organizer, control circuit, or other electronic device. The processor-based system 600 may include one or more processors 602, such as a microprocessor, to control the processing of system functions and requests in the processor-based system 600. The processor 602 and other subcomponents of the processor-based system 600 may include one or more of a microelectronic device and a microelectronic device structure previously described herein and manufactured in accordance with embodiments of the present disclosure.

The processor-based system 600 may include a power supply 604 in operable communication with the processor 602. For example, if the processor-based system 600 is a portable system, the power supply 604 may include one or more of a fuel cell, a power scavenging device, permanent batteries, replaceable batteries, and rechargeable batteries. The power supply 604 may also include an AC adapter; therefore, the processor-based system 600 may be plugged into a wall outlet, for example. The power supply 604 may also include a DC adapter such that the processor-based system 600 may be plugged into a vehicle cigarette lighter or a vehicle power port, for example.

Various other devices may be coupled to the processor 602 depending on the functions that the processor-based system 600 performs. For example, a user interface 606 may be coupled to the processor 602. The user interface 606 may include input devices such as buttons, switches, a keyboard, a light pen, a mouse, a digitizer and stylus, a touch screen, a voice recognition system, a microphone, or a combination thereof. A display 608 may also be coupled to the processor 602. The display 608 may include an LCD display, an SED display, a CRT display, a DLP display, a plasma display, an OLED display, an LED display, a three-dimensional projection, an audio display, or a combination thereof. Furthermore, an RF sub-system/baseband processor 610 may also be coupled to the processor 602. The RF sub-system/baseband processor 610 may include an antenna that is coupled to an RF receiver and to an RF transmitter (not shown). A communication port 612, or more than one communication port 612, may also be coupled to the processor 602. The communication port 612 may be adapted to be coupled to one or more peripheral devices 614, such as a modem, a printer, a computer, a scanner, or a camera, or to a network, such as a local area network, remote area network, intranet, or the Internet, for example.

The processor 602 may control the processor-based system 600 by implementing software programs stored in the memory. The software programs may include an operating system, database software, drafting software, word processing software, media editing software, or media playing software, for example. The memory is operably coupled to the processor 602 to store and facilitate execution of various programs. For example, the processor 602 may be coupled to system memory 616, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 616 may include volatile memory, non-volatile memory, or a combination thereof. The system memory 616 is typically large so that it can store dynamically loaded applications and data. In some embodiments, the system memory 616 may include semiconductor devices, such as one or more of a microelectronic devices device and a microelectronic device structure previously described herein.

The processor 602 may also be coupled to non-volatile memory 618, which is not to suggest that system memory 616 is necessarily volatile. The non-volatile memory 618 may include one or more of STT-MRAM, MRAM, read-only memory (ROM) such as an EPROM, resistive read-only memory (RROM), and flash memory to be used in conjunction with the system memory 616. The size of the non-volatile memory 618 is typically selected to be just large enough to store any necessary operating system, application programs, and fixed data. Additionally, the non-volatile memory 618 may include a high-capacity memory such as disk drive memory, such as a hybrid-drive including resistive memory or other types of non-volatile solid-state memory, for example. The non-volatile memory 618 may include microelectronic devices, such as one or more of a microelectronic device and a microelectronic device structure previously described herein.

Thus, in accordance with embodiments of the disclosure an electronic system comprises an input device, an output device, a processor device operably coupled to the input device and the output device, and a memory device operably coupled to the processor device and comprising at least one microelectronic device. The at least one microelectronic device comprises a staircase structure within a stack structure and comprising a vertically alternating sequence of conductive structure and insulative structure arranged in tiers, support pillar structures extending through the stack structure, the support pillar structures arranged in rows located horizontally between first slot structures, and a second slot structure at least partially vertically extending into the stack structure and at least partially into support pillar structures of one of the rows of support pillar structures.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a stack structure comprising a vertically alternating sequence of conductive structures and insulative structures arranged in tiers, the stack structure divided into block structures separated from one another by slot structures;
   a staircase structure within the stack structure having steps comprising horizontal edges of the tiers;
   conductive contact structures in contact with the steps of the staircase structure;
   support pillar structures extending through the stack structure; and
   additional slot structures extending partially through the stack structure within one of the block structures, one of the additional slot structures extending between horizontally neighboring support pillar structures and located closer to one of the horizontally neighboring support pillar structures than another one of the horizontally neighboring support pillar structures, another one of the additional slot structures comprising a segmented additional slot structure horizontally extending at least partially into each support pillar structure of a row of support pillar structures horizontally neighboring one another.

2. The microelectronic device of claim 1, wherein the stack structure further comprises a crest region horizontally neighboring the staircase structure, additional support pillar structures located within the crest region.

3. The microelectronic device of claim 2, wherein the additional support pillar structures within the crest region are electrically coupled to conductive contacts.

4. The microelectronic device of claim 1, wherein the support pillar structures are arranged in three rows, each row of support pillar structures extending substantially parallel to the slot structures.

5. The microelectronic device of claim 4, wherein a central row of the support pillar structures is intersected by one of the additional slot structures.

6. The microelectronic device of claim 1, wherein the conductive contact structures are substantially equally horizontally spaced from horizontally neighboring additional slot structures of the additional slot structures.

7. The microelectronic device of claim 1, wherein a center of each of the conductive contact structures is located within horizontal boundaries of a horizontally neighboring support pillar structure.

8. A microelectronic device, comprising:
   a stack structure comprising alternating conductive structures and insulative structures arranged in tiers;
   a staircase structure within the stack structure and having steps comprising horizontal ends of the tiers;
   slot structures vertically extending through the stack structure and extending in a first horizontal direction;
   additional slot structures extending in the first horizontal direction between slot structures neighboring each other in a second horizontal direction; and
   support pillar structures vertically extending through the stack structure and arranged in rows, one of the rows of the support pillar structures at least partially intersected by one of the additional slot structures, another one of the additional slot structures located between horizontally neighboring rows of the support pillar structures, the another one of the additional slot structures closer to one of the rows of the support pillar structures than to the other row.

9. The microelectronic device of claim 8, wherein the additional slot structures vertically extend partially into the stack structure.

10. The microelectronic device of claim 8, wherein a distance between horizontally neighboring additional slot structures is less than a distance between one of the slot structures and a nearest one of the additional slot structures.

11. The microelectronic device of claim 8, wherein the support pillar structures of the one of the rows of support pillar structures at least partially intersected by the one of the additional slot structures are in electrical communication with a corresponding conductive contact.

12. The microelectronic device of claim 8, further comprising conductive contact structures in electrical communication with the steps of the staircase structure, the conductive contact structures horizontally offset from the support pillar structures in the first horizontal direction.

13. The microelectronic device of claim 12, wherein the conductive contact structures comprise four conductive contact structures horizontally neighboring each other in the second horizontal direction and located between horizontally neighboring slot structures.

14. The microelectronic device of claim 8, further comprising memory strings extending through the stack structure.

15. A memory device, comprising:
a stack structure comprising a vertically alternating sequence of conductive structures and insulative structures arranged in tiers, the stack structure divided into block structures separated from one another by slot structures;
strings of memory cells vertically extending through the stack structure;
additional slot structures within horizontally boundaries of a block structure and extending substantially parallel to the slot structures, the additional slot structures dividing the block structure into sub-block structures, one or more of the sub-block structures having a different width than one or more of the other sub-block structures; and
support pillar structures arranged in rows within each of the sub-block structures.

16. The memory device of claim 15, wherein sub-block structures horizontally neighboring the slot structures have a greater width than sub-block structures horizontally spaced from the slot structures by at least one sub-block structure.

17. The memory device of claim 15, wherein support pillar structures of a first sub-block structure of the sub-block structures are located closer to a first additional slot structure of the additional slot structures than support pillar structures of a second sub-block structure of the sub-block structures spaced from the first sub-block structure by the first additional slot structure.

18. The memory device of claim 15, wherein the additional slot structures vertically extend partially through the stack structure.

19. An electronic system, comprising:
an input device;
an output device;
a processor device operably coupled to the input device and the output device; and
a memory device operably coupled to the processor device and comprising at least one microelectronic device structure, the at least one microelectronic device structure comprising:
a staircase structure within a stack structure and comprising a vertically alternating sequence of conductive structure and insulative structure arranged in tiers, the staircase structure having steps comprising horizontal edges of the tiers;
conductive contact structures in contact with the steps of the staircase structure;
support pillar structures extending through the stack structure, the support pillar structures arranged in rows located horizontally between first slot structures, the stack structure divided into block structures separated from one another by the first slot structures; and
second slot structures at least partially vertically extending into the stack structure and at least partially into support pillar structures of one of the rows of support pillar structures, one of the second slot structures extending between horizontally neighboring support pillar structures and located closer to one of the horizontally neighboring support pillar structures than to another one of the support pillar structures, another one of the second slot structures comprising a segmented additional slot structure horizontally extending at least partially into each support pillar structure of a row of support pillar structures horizontally neighboring one another.

20. The electronic system of claim 19, further comprising conductive contacts in electrical communication with some of the support pillar structures.

21. The electronic system of claim 20, wherein the conductive contacts in electrical communication with the some of the support pillar structures exhibit a horizontal dimension greater than a horizontal dimension of other conductive contacts in electrical communication with others of the support pillar structures.

22. The electronic system of claim 19, wherein the one of the second slot structures is closer to one of the rows of the support pillar structures than to a second one of the rows of the support pillar structures.

* * * * *

UNITED STATES PATENT AND TRADEMARK OFFICE
CERTIFICATE OF CORRECTION

PATENT NO. : 11,605,642 B2
APPLICATION NO. : 17/124313
DATED : March 14, 2023
INVENTOR(S) : Shuangqiang Luo and Brett D. Lowe It is certified that error appears in the above-identified patent and that said Letters Patent is hereby corrected as shown below:

In the Specification

| | | |
|---|---|---|
| Column 10, | Line 27, | change "such as such as one" to --such as one-- |
| Column 11, | Line 66, | change "Sift." to --$SiO_2$.-- |
| Column 23, | Line 11, | change "devices device and" to --device and-- |

Signed and Sealed this
Thirty-first Day of October, 2023

Katherine Kelly Vidal
*Director of the United States Patent and Trademark Office*